(12) United States Patent
Oh et al.

(10) Patent No.: US 12,167,635 B2
(45) Date of Patent: Dec. 10, 2024

(54) DISPLAY PANEL AND DISPLAY DEVICE USING SAME

(71) Applicant: LG Display Co., Ltd., Seoul (KR)

(72) Inventors: Seung Taek Oh, Paju-si (KR); Seong Ho Cho, Paju-si (KR); Min Sung Kang, Paju-si (KR); Bo Gun Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 159 days.

(21) Appl. No.: 17/398,694

(22) Filed: Aug. 10, 2021

(65) Prior Publication Data

US 2022/0115456 A1    Apr. 14, 2022

(30) Foreign Application Priority Data

Oct. 12, 2020  (KR) .................. 10-2020-0131112

(51) Int. Cl.
*G09G 3/3291* (2016.01)
*H10K 59/121* (2023.01)
*H10K 59/35* (2023.01)

(52) U.S. Cl.
CPC ......... *H10K 59/121* (2023.02); *G09G 3/3291* (2013.01); *H10K 59/352* (2023.02); *H10K 59/353* (2023.02)

(58) Field of Classification Search
CPC ............... H10K 59/121; H10K 59/65; H10K 59/351–353; G09G 3/3233; G09G 3/3291; G09G 2300/0452; G09F 2201/52
See application file for complete search history.

(56) References Cited

U.S. PATENT DOCUMENTS

| | | | |
|---|---|---|---|
| 9,613,563 B2 | 4/2017 | Seong et al. | |
| 10,777,122 B2 | 9/2020 | Kim et al. | |
| 2016/0203748 A1* | 7/2016 | Matsueda | H10K 59/353 |
| | | | 345/694 |
| 2018/0061368 A1* | 3/2018 | Sako | G09G 3/342 |
| 2019/0312098 A1* | 10/2019 | Matsueda | H10K 59/131 |
| 2020/0394964 A1* | 12/2020 | Hyun | H10K 59/121 |
| 2021/0304663 A1* | 9/2021 | Kim | G09G 3/3275 |
| 2021/0399060 A1* | 12/2021 | Seo | H10K 59/126 |
| 2023/0043626 A1* | 2/2023 | Cong | G09G 3/32 |

FOREIGN PATENT DOCUMENTS

| | | |
|---|---|---|
| CN | 104580828 A | 4/2015 |
| CN | 109508133 A | 3/2019 |
| CN | 109979336 A | 7/2019 |
| CN | 111258527 A | 6/2020 |
| CN | 111443765 A | 7/2020 |
| CN | 113823662 A | 12/2021 |
| KR | 10-2020-0052246 A | 5/2020 |
| KR | 10-2020-0058891 A | 5/2020 |
| TW | M459491 U | 8/2013 |

* cited by examiner

*Primary Examiner* — Eric K Ashbahian
(74) *Attorney, Agent, or Firm* — Seed IP Law Group LLP

(57) ABSTRACT

The present disclosure relates to a display panel and a display device using the same. Between first and second pixel areas having different pixels per inch, a third pixel area is provided to have the same pixels per inch as the first pixel area. In the third pixel area, some of pixels emit light as ON pixels, and remaining background pixels except for the ON pixels are driven as OFF pixels or low luminance pixels.

21 Claims, 22 Drawing Sheets

FIG. 13
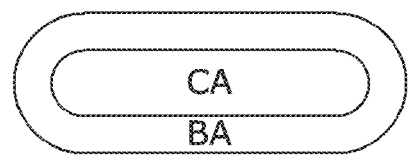
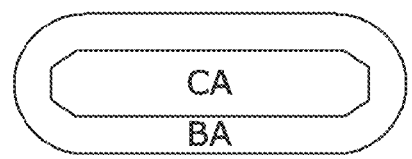
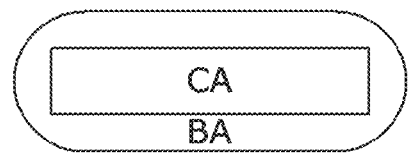
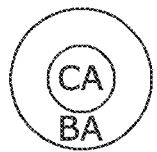

DISPLAY PANEL AND DISPLAY DEVICE USING SAME

CROSS-REFERENCE TO RELATED APPLICATION

This application claims priority to and the benefit of Korean Patent Application No. 10-2020-0131112, filed Oct. 12, 2020, the disclosure of which is incorporated herein by reference in its entirety.

BACKGROUND

Technical Field

The present disclosure relates to a display panel having partially different resolution or pixels per inch (PPI), and a display device using the same.

Description of the Related Art

Electroluminescent display devices are roughly classified into inorganic light emitting display devices and organic light emitting display devices depending on the material of an emission layer. The organic light emitting display device of an active matrix type includes an organic light emitting diode (hereinafter, referred to as "OLED") that emits light by itself, and has an advantage in that the response speed is fast and the luminous efficiency, luminance, and viewing angle are large. In the organic light emitting display device, the OLED is formed in each pixel. The organic light emitting display device has a fast response speed, excellent luminous efficiency, luminance, and viewing angle, and has excellent contrast ratio and color reproducibility since it can express black gradations in complete black.

Multi-media functions of mobile terminals have been improved. For example, a camera is built into a smartphone by default, and the resolution of the camera is increasing to the level of a conventional digital camera. A front camera of the smartphone restricts a screen design, making it difficult to design the screen. In order to reduce a space occupied by the camera, a screen design including a notch or punch hole has been adopted in the smartphone, but the screen size is still limited due to the camera, making it impossible to implement a full-screen display.

BRIEF SUMMARY

One or more embodiments of the present disclosure solve the above-mentioned needs as well as other problems in the related art.

The present disclosure provides a display panel in which a full-screen display is implemented and a boundary line between pixel areas having different resolutions of pixels or different pixels per inch (PPI) is not visually recognized, and a display device using the same.

It should be noted that the technical benefits of the present disclosure are not limited to the above-described benefits, and other benefits of the present disclosure will be apparent to those skilled in the art from the following descriptions.

A display panel according to an embodiment of the present disclosure includes: a first pixel area in which pixels are arranged; a second pixel area in which pixels are arranged with lower pixels per inch (PPI) than that of the first pixel area; and a third pixel area disposed between the first pixel area and the second pixel area, and in which pixels are arranged with the same PPI as that of the first pixel area. Some of the pixels in the third pixel area emit light as ON pixels. Remaining background pixels except for the ON pixels in the third pixel area are driven as OFF pixels or low luminance pixels. Pixel data is written to the ON pixels and the low luminance pixels, and the luminance of the low luminance pixels is lower than that of the ON pixels. The OFF pixels are turned off to display a black grayscale.

The display device of the present disclosure includes a display panel including a first pixel area in which pixels are arranged, a second pixel area in which pixels are arranged with lower pixels per inch (PPI) than that of the first pixel area, and a third pixel area disposed between the first pixel area and the second pixel area and in which pixels are arranged with the same PPI as that of the first pixel area; and a boundary pixel area control unit configured to control some of the pixels in the third pixel area to be ON pixels, and control remaining background pixels except for the ON pixels in the third pixel area to be OFF pixels that are turned off or low luminance pixels.

In the present disclosure, since pixels are arranged in the second pixel area where the sensor is disposed, a full-screen display may be implemented.

In the present disclosure, a third pixel area of a predetermined (or selected) size may be disposed at the boundary between the first pixel area and the second pixel area having different resolutions or PPI, and the PPI of the third pixel area may be adjusted by pixels that are electrically turned on/off, thereby reducing or minimizing a luminance difference between the first pixel area and the second pixel area and preventing a boundary line between pixel areas from being visible without changing the design of a pixel array or the process of the display panel.

In the present disclosure, the background pixels between the ON pixels in the third pixel area are driven as low luminance pixels, so that a luminance change may be smoothly controlled at a boundary between pixel areas, and the boundary line between pixel areas may be prevented from being visible.

In the present disclosure, the background pixels between the ON pixels in the third pixel area are driven as low luminance pixels, so that a flicker in the third pixel area may be prevented in a low speed driving mode in which a frame frequency is lowered.

The effects of the present disclosure are not limited to the above-mentioned effects, and other effects not mentioned will be clearly understood by those skilled in the art from the description of the claims.

BRIEF DESCRIPTION OF THE SEVERAL VIEWS OF THE DRAWINGS

The above and other features, and advantages of the present disclosure will become more apparent to those of ordinary skill in the art by describing embodiments thereof in detail with reference to the attached drawings, in which:

FIG. 13 is a diagram showing various shapes of second and third pixel areas;

DETAILED DESCRIPTION

Figure 1:
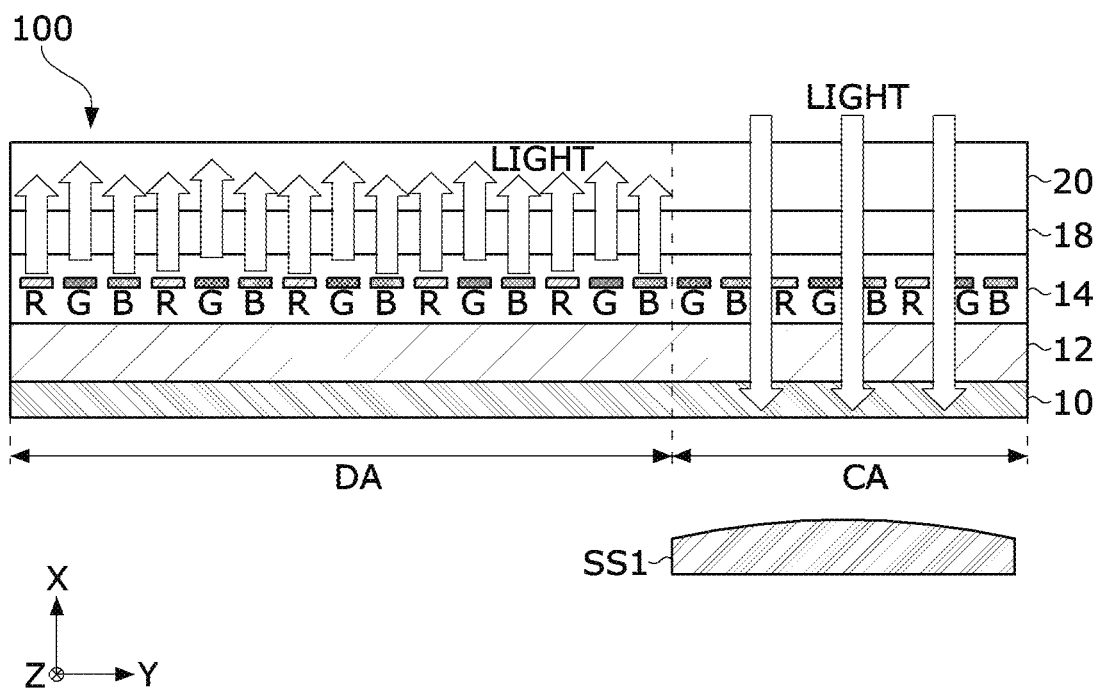
FIG. 1 is a cross-sectional view schematically showing a display panel according to an embodiment of the present disclosure.

Advantages and features of the present disclosure, and a method of achieving them will become apparent with reference to the embodiments described below in detail together with the accompanying drawings. However, the present disclosure is not limited to the embodiments disclosed below, but will be implemented in a variety of different forms. However, the present embodiments are provided to complete the present disclosure, and to fully inform the scope of the disclosure to those of ordinary skill in the art.

The shapes, sizes, ratios, angles, numbers, and the like disclosed in the drawings for explaining the embodiments of the present disclosure are examples, and thus the present disclosure is not limited to the illustrated matters. The same reference numerals used herein refer to the same components. In addition, in describing the present disclosure, when it is determined that a detailed description of a related known technique may unnecessarily obscure the subject matter of the present disclosure, the detailed description thereof will be omitted.

When terms such as "include," "have," are used herein, other parts may be added unless "only" is used. In the case of expressing the components in the singular, it includes the case of including the plural unless specifically stated otherwise.

In interpreting the components, it is interpreted as including an error range even if there is no explicit description.

In the case of a description of the positional relationship, for example, if the positional relationship of two parts is described as terms such as "on ~," "above ~," "below ~," and "beside ~," one or more other parts may be located between the two parts unless "right," or "directly" is used.

The term "unit" may include any electrical circuitry, features, components, an assembly of electronic components or the like. That is, "unit" may include any processor-based or microprocessor-based system including systems using microcontrollers, integrated circuit, chip, microchip, reduced instruction set computers (RISC), application specific integrated circuits (ASICs), field-programmable gate arrays (FPGAs), graphical processing units (GPUs), logic circuits, and any other circuit or processor capable of executing the various operations and functions described herein. The above examples are examples only, and are thus not intended to limit in any way the definition or meaning of the term "unit." In some embodiments, the various units described herein may be included in or otherwise implemented by processing circuitry such as a microprocessor, microcontroller, or the like.

In the description of the embodiments, first, second, and the like are used to describe various components, but these components are not limited by these terms. These terms are only used to distinguish one component from another component. Accordingly, a first component mentioned below may be a second component within the technical spirit of the present disclosure.

The same reference numerals used herein refer to the same components.

Features of the various embodiments may be partially or entirely coupled or combined with each other, various interlocking and driving are technically possible, and the embodiments may be implemented independently of each other or may be implemented together in a related relationship.

In a display device of the present disclosure, a pixel circuit may include a plurality of transistors. The transistors may be implemented as an oxide thin film transistor (TFT) including an oxide semiconductor, a low temperature polysilicon (LTPS) TFT including the LTPS, or the like. Each of the transistors may be implemented as a p-channel TFT or an n-channel TFT.

The transistor is a three-electrode element including a gate, a source, and a drain. The source is an electrode that supplies carriers to the transistor. In the transistor, the carriers start flowing from the source. The drain is an electrode through which the carriers exit from the transistor. In the transistor, the carriers flow from the source to the drain. In the case of an n-channel transistor, since the carriers are electrons, a source voltage is lower than a drain voltage so that the electrons can flow from the source to the drain. In the n-channel transistor, a current flows from the drain to the source. In the case of a p-channel transistor, since the carriers are holes, the source voltage is higher than the drain voltage so that the holes can flow from the source to the drain. In the p-channel transistor, since the holes flow from the source to the drain, a current flows from the source to the drain. It should be noted that the source and drain of the transistor are not fixed. For example, the source and the drain may be changed according to an applied voltage. Therefore, the present disclosure is not limited due to the source and drain of the transistor. In the following description, the source and drain of the transistor will be referred to as first and second electrodes.

A gate signal swings between a gate-on voltage and a gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, while it is turned off in response to the gate-off voltage. In the case of the n-channel transistor, the gate-on voltage may be a gate high voltage VGH/VEH, and the gate-off voltage may be a gate low voltage VGL/VEL. In the case of the p-channel transistor, the gate-on voltage may be the gate low voltage VGL/VEL, and the gate-off voltage may be the gate high voltage VGH/VEH.

Hereinafter, various embodiments of the present disclosure will be described in detail with reference to the accompanying drawings.

Figure 2:
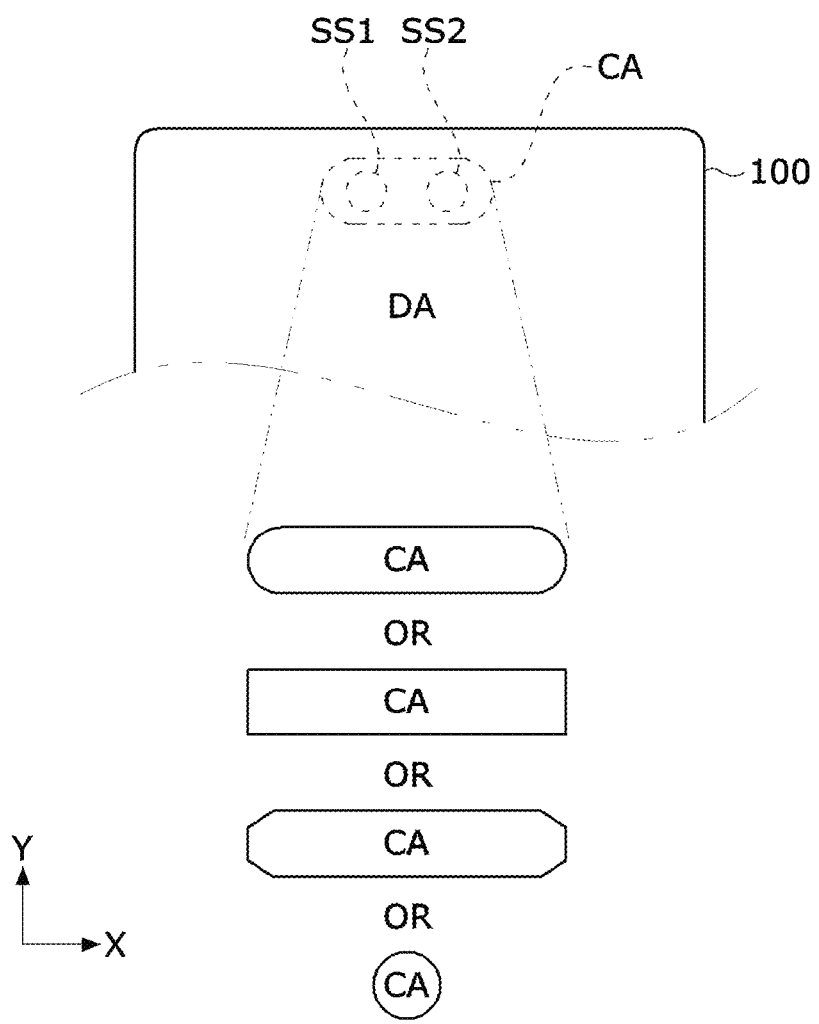
FIG. 2 is a plan view showing an area in which a sensor module is disposed in a screen of a display panel.

Referring to FIGS. 1 and 2, a display panel 100 includes a screen for reproducing an input image. The screen may be divided into first and second pixel areas DA and CA having different resolutions.

Each of the first pixel area DA and the second pixel area CA includes a pixel array in which pixels to which pixel data of the input image is written are arranged. The second pixel area CA may be a pixel area having a resolution lower than that of the first pixel area DA. The pixel array of the first pixel area DA may include pixels arranged with high pixels per inch (PPI). The pixel array of the second pixel area CA may include pixels arranged with low PPI. The boundary line between the second pixel area CA and the first pixel area DA may, as shown in FIG. 2, have various shapes, for example, a shape of an ellipse, a rectangle, an octagon, or a circle.

As illustrated in FIG. 2, one or more sensor modules SS1 and SS2 facing the second pixel area CA may be disposed in the lower portion of the display panel 100. For example, various sensors such as an imaging module including an image sensor, an infrared sensor module, and an illuminance sensor module may be disposed in the lower portion of the second pixel area CA of the display panel 100. The second pixel area CA may include a light transmitting portion to increase the transmittance of light directed to the sensor module.

Since the first pixel area DA and the second pixel area CA include pixels, the input image may be displayed in the first pixel area DA and the second pixel area CA.

Each of the pixels in the first pixel area DA and the second pixel area CA includes sub-pixels having different colors to reproduce colors in an image. The sub-pixels include a red sub-pixel (hereinafter referred to as "R sub-pixel"), a green sub-pixel (hereinafter referred to as "G sub-pixel"), and a blue sub-pixel (hereinafter referred to as "B sub-pixel"). Although not shown, each of the pixels may further include a white sub-pixel (hereinafter referred to as "W sub-pixel"). Each of the sub-pixels may include a pixel circuit that drives a light emitting element.

An image quality compensation algorithm for compensating the luminance and color coordinates of pixels may be applied to the second pixel area CA having a PPI lower than that of the first pixel area DA.

In the display device of the present disclosure, since pixels are arranged in the second pixel area CA where the sensor is disposed, the display area of the screen is not limited due to an imaging module such as a camera. Accordingly, the display device of the present disclosure may implement a full-screen display.

The display panel 100 has a width in an X-axis direction, a length in a Y-axis direction, and a thickness in a Z-axis direction. The display panel 100 may include a circuit layer 12 disposed on a substrate and a light emitting element layer 14 disposed on the circuit layer 12. A polarizing plate 18 may be disposed on the light emitting element layer 14, and a cover glass 20 may be disposed on the polarizing plate 18.

The circuit layer 12 may include a pixel circuit connected to wires such as data lines, gate lines, and power lines, and a gate driver connected to the gate lines. The circuit layer 12 may include transistors implemented as thin film transistors (TFT) and circuit elements such as capacitors. The wires and circuit elements of the circuit layer 12 may be implemented with a plurality of insulating layers, two or more metal layers separated with an insulating layer therebetween, and an active layer including a semiconductor material.

The light emitting element layer 14 may include a light emitting element driven by the pixel circuit. The light emitting element may be implemented with an OLED. The OLED includes an organic compound layer formed between an anode and a cathode. The organic compound layer may include a hole injection layer HIL, a hole transport layer HTL, an emission layer EML, an electron transport layer ETL, and an electron injection layer EIL, but is not limited thereto. When a voltage is applied to the anode and cathode of the OLED, holes that have passed through the hole transport layer HTL and electrons that have passed through the electron transport layer ETL move to the emission layer EML to form excitons, and as a result, visible light is emitted from the emission layer EML. The light emitting element layer 14 may be disposed on pixels that selectively transmit red, green, and blue wavelengths and may further include a color filter array.

The light emitting element layer 14 may be covered with a passivation layer, and the passivation layer may be covered with an encapsulation layer. The passivation layer and the encapsulation layer may have a structure in which an organic film and an inorganic film are alternately stacked. The inorganic film blocks the penetration of moisture or oxygen. The organic film flattens the surface of the inorganic film. When the organic film and the inorganic film are stacked in multiple layers, the movement path of moisture or oxygen becomes longer than that in a single layer, so that the penetration of moisture/oxygen affecting the light emitting element layer 14 may be effectively blocked.

The polarizing plate 18 may be adhered to the encapsulation layer. The polarizing plate 18 improves outdoor visibility of the display device. The polarizing plate 18 reduces light reflected from the surface of the display panel 100 and blocks light reflected from the metal of the circuit layer 12 to improve brightness of the pixels. The polarizing plate 18 may be implemented as a polarizing plate in which a linear polarizing plate and a phase delay film are bonded, or a circular polarizing plate.

Figure 3:
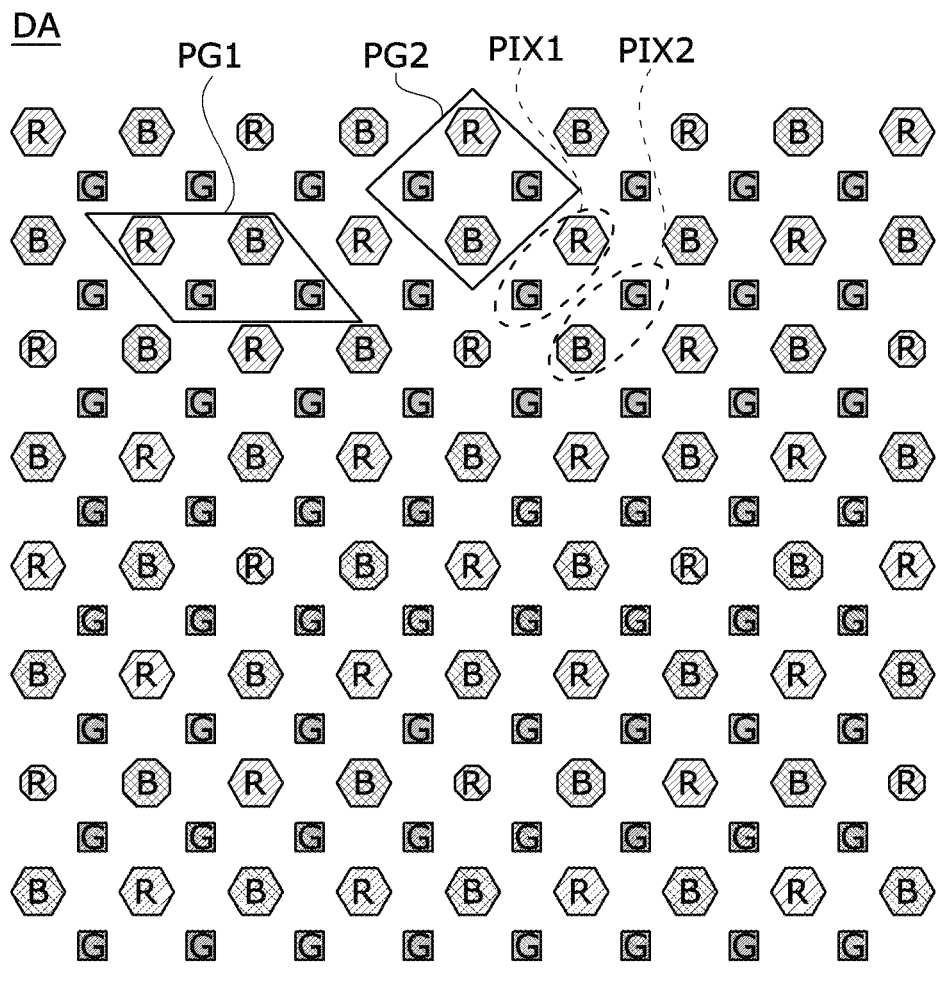
FIG. 3 is a diagram showing an arrangement of pixels in a first pixel area.
Figure 4:
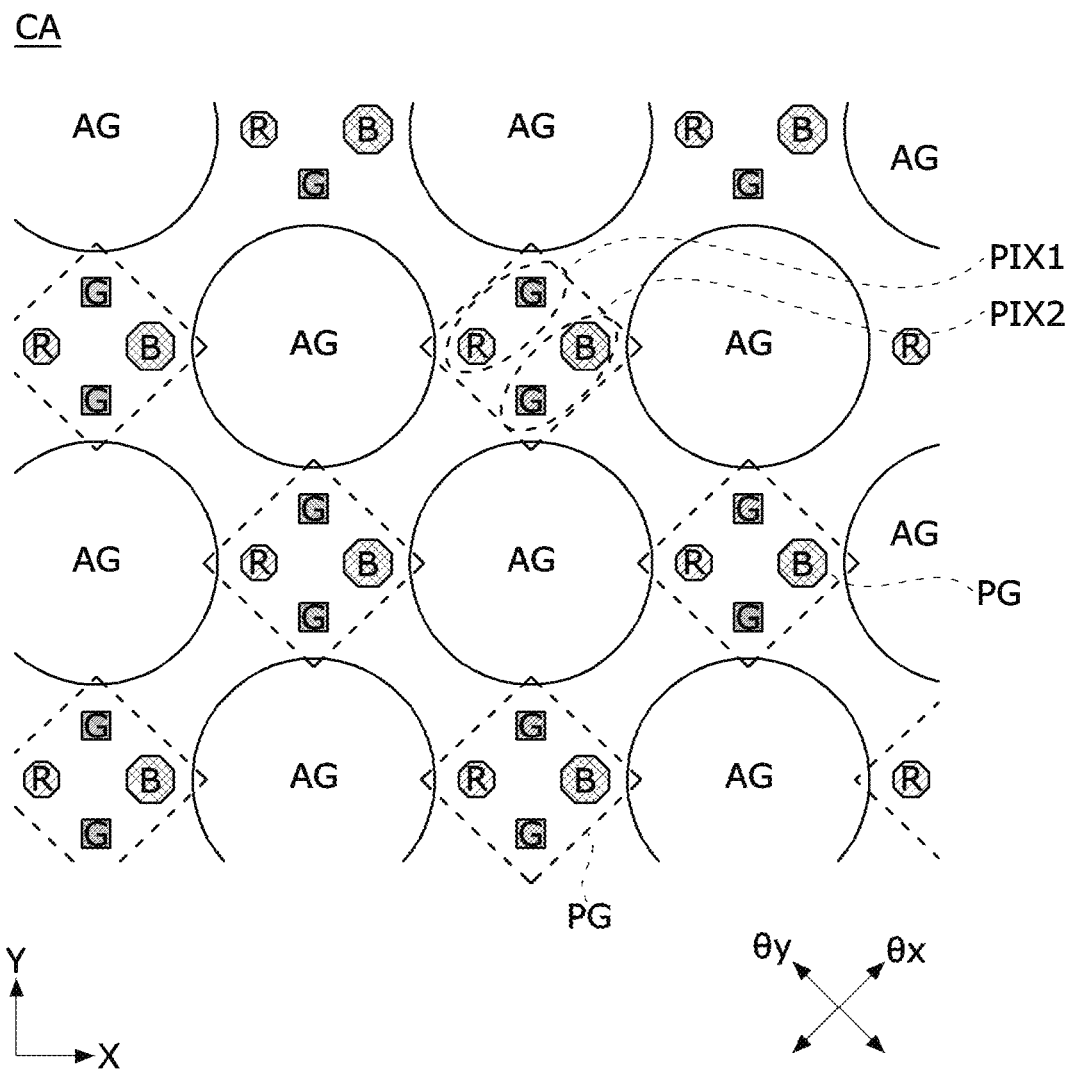
FIG. 4 is a diagram showing an arrangement of pixels in a second pixel area.

FIG. 3 is a diagram illustrating an example of pixel arrangement in the first pixel area DA. FIG. 4 is a diagram illustrating an example of a light transmitting portion and pixels in the second pixel area CA. In FIGS. 3 and 4, wires connected to the pixels are omitted.

Referring to FIG. 3, the first pixel area DA includes pixels PIX1 and PIX2 arranged with high PPI. Each of the pixels PIX1 and PIX2 may be implemented as a real type pixel in which R, G, and B sub-pixels of three primary colors constitute one pixel. Each of the pixels PIX1 and PIX2 may further include a W sub-pixel omitted from the drawing.

Each of the pixels may be composed of two sub-pixels using a sub-pixel rendering algorithm. For example, a first pixel PIX1 may be composed of an R sub-pixel and a first G sub-pixel, and a second pixel PIX2 may be composed of a B sub-pixel and a second G sub-pixel. Insufficient color representation in each of the first and second pixels PIX1 and PIX2 may be compensated by an average value of corresponding color data between neighboring pixels.

The pixels in the first pixel area DA may be defined as unit pixel groups PG1 and PG2 having a predetermined (or selected) size. The unit pixel groups PG1 and PG2 are pixel areas of the predetermined (or selected) size including four sub-pixels. The unit pixel groups PG1 and PG2 are repeatedly arranged in a first direction (X-axis), in a second direction (Y-axis) perpendicular to the first direction, and in an inclined direction (θx and θy axes) between the first and second directions. θx and θy denote the directions of the inclined axes formed by rotating the X-axis and Y-axis by 45°, respectively.

The unit pixel groups PG1 and PG2 may be a parallelogram-shaped pixel area PG1 or a rhombus-shaped pixel area PG2. The unit pixel groups PG1 and PG2 should be interpreted as including a rectangular shape, a square shape, and the like.

The sub-pixels of the unit pixel groups PG1 and PG2 include a sub-pixel of a first color, a sub-pixel of a second color, and a sub-pixel of a third color, in which two sub-pixels of any one of the first to third color are included. For example, the unit pixel groups PG1 and PG2 may include one R sub-pixel, two G sub-pixels, and one B sub-pixel. In the sub-pixels in the unit pixel groups PG1 and PG2, the luminous efficiency of the light emitting element may be different for each color. In consideration of this, the size of the sub-pixels may vary for each color. For example, among the R, G, and B sub-pixels, the B sub-pixel may be the largest and the G sub-pixel may be the smallest.

Referring to FIG. 4, the second pixel area CA includes pixel groups PG spaced apart by a predetermined (or selected) distance and light transmitting portions AG disposed between the neighboring pixel groups PG. External light is received by the lens of the sensor module through the light transmitting portions AG. The light transmitting portions AG may include transparent media having high transmittance without metal so that light may be incident with minimal light loss. In other words, the light transmitting portions AG may be formed of transparent insulating materials without including metal wires or pixels. The PPI of the second pixel area CA is lower than that of the first pixel area DA due to the light transmitting portions AG.

The pixel group PG of the second pixel area CA may include one or two pixels. Each pixel of the pixel group may include two to four sub-pixels. For example, one pixel in the pixel group may include R, G, and B sub-pixels or may include two sub-pixels, and further a W sub-pixel. In the example of FIG. 4, a first pixel PIX1 is composed of R and G sub-pixels, and a second pixel PIX2 is composed of B and G sub-pixels, but the present disclosure is not limited thereto.

The shape of the light transmitting portions AG is illustrated to be circular in FIG. 4, but is not limited thereto. For example, the light transmitting portions AG may be designed in various shapes such as a circle, an ellipse, and a polygon.

Due to process deviation and element properties deviation caused in the manufacturing process of the display panel, there may be a difference in the electrical properties of a driving element between pixels, and this difference may be increased as the driving time of the pixels elapses. In order to compensate for deviation in the electrical properties of the driving element between pixels, an internal compensation technique or an external compensation technique may be applied to an organic light emitting display device.

The internal compensation technique senses a threshold voltage of the driving element for each sub-pixel by using an internal compensation circuit implemented in each pixel circuit, and compensates a gate-source voltage Vgs of the driving element by the threshold voltage. The external compensation technique senses in real time a current or voltage of the driving element that varies depending on the electrical properties of the driving elements, by using an external compensation circuit. The external compensation technique modulates pixel data (digital data) of an input image as much as the deviation in the electrical properties (or variation) of the driving element sensed for each pixel, thereby compensating the electrical properties deviation (or variation) of the driving element in each of the pixels in real time.

Figure 5:
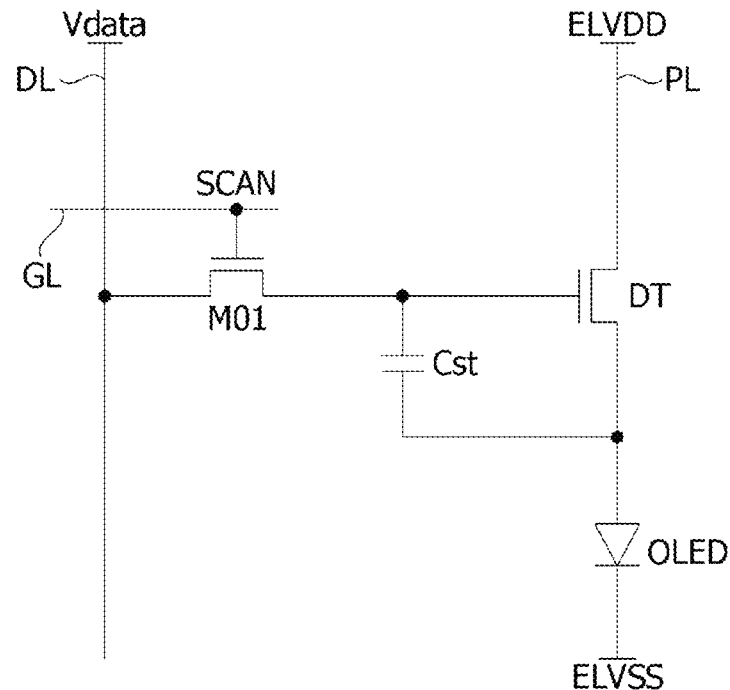
FIGS. 5 to 7 are circuit diagrams showing various pixel circuits applicable to the present disclosure.
Figure 6:
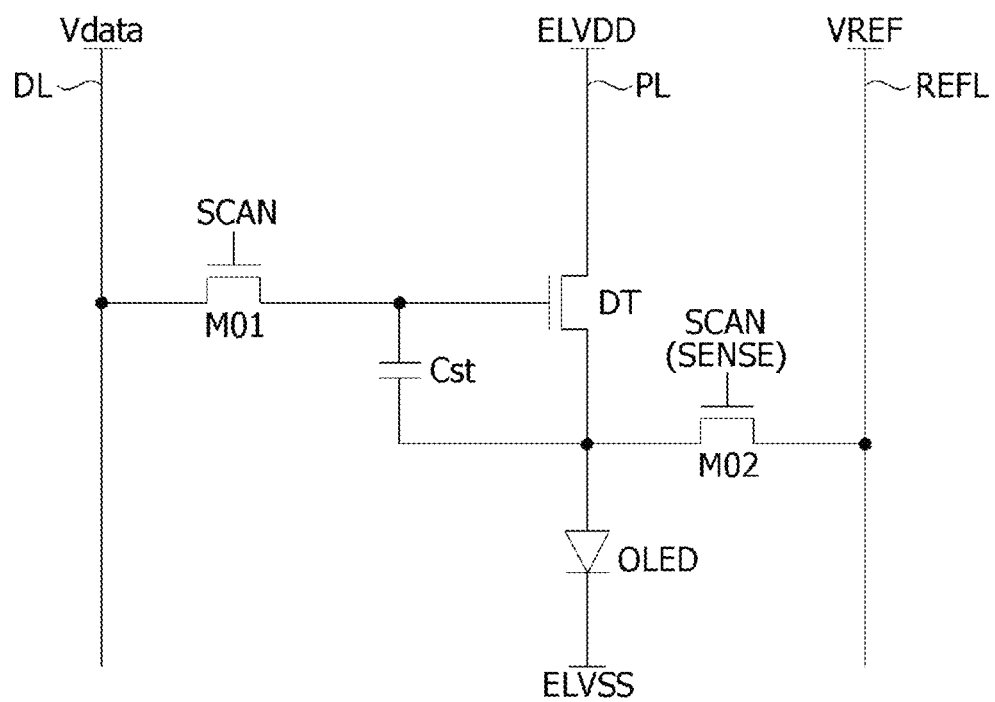
Figure 7:
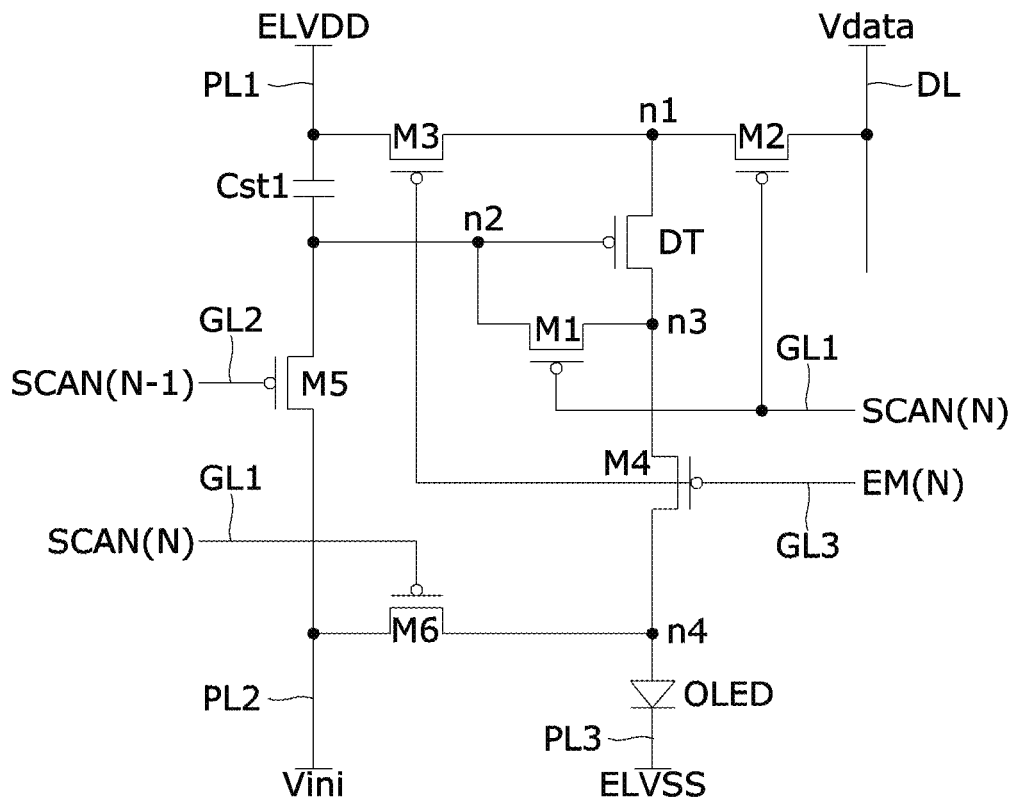

FIGS. 5 to 7 are circuit diagrams showing various pixel circuits applicable to the present disclosure.

Referring to FIG. 5, the pixel circuit includes a light emitting element OLED, a driving element DT for supplying a current to the light emitting element OLED, a switch element M01 for connecting a data line DL in response to a scan pulse SCAN, and a capacitor Cst connected to the gate electrode of the driving element DT. The driving element DT and the switch element M01 may be implemented with n-channel transistors.

A pixel driving voltage ELVDD is applied to the first electrode of the driving element DT through a power line PL. The driving element DT drives the light emitting element OLED by supplying a current to the light emitting element OLED according to the gate-source voltage Vgs. The light emitting element OLED is turned on and emits light when a forward voltage between the anode electrode and the cathode electrode is greater than or equal to the threshold voltage. The capacitor Cst is connected between the gate electrode and the source electrode of the driving element DT to maintain the gate-source voltage Vgs of the driving element DT.

FIG. 6 is an example of a pixel circuit connected to an external compensation circuit.

Referring to FIG. 6, the pixel circuit further includes a second switch element M02 connected between a reference voltage line REFL and the second electrode (or source electrode) of the driving element DT. In this pixel circuit, the driving element DT and the switch elements M01 and M02 may be implemented as n-channel transistors.

The second switch element M02 applies a reference voltage VREF in response to the scan pulse SCAN or a separate sensing pulse SENSE. The reference voltage VREF is applied to the pixel circuit through the reference voltage line REFL.

In a sensing mode, a current flowing through a channel of the driving element DT or a voltage between the driving element DT and the light emitting element OLED is sensed through the reference voltage line REFL. A current flowing through the reference voltage line REFL is converted into a voltage through an integrator and converted into digital data through an analog-to-digital converter (ADC). This digital data is sensing data including information on a threshold voltage or mobility of the driving element DT. The sensing data is transmitted to a data operation unit. The data operation unit may receive the sensing data from the ADC and add or multiply a compensation value selected based on the sensing data to or by the pixel data, thereby compensating for driving deviation and deterioration of pixels.

Figure 8:
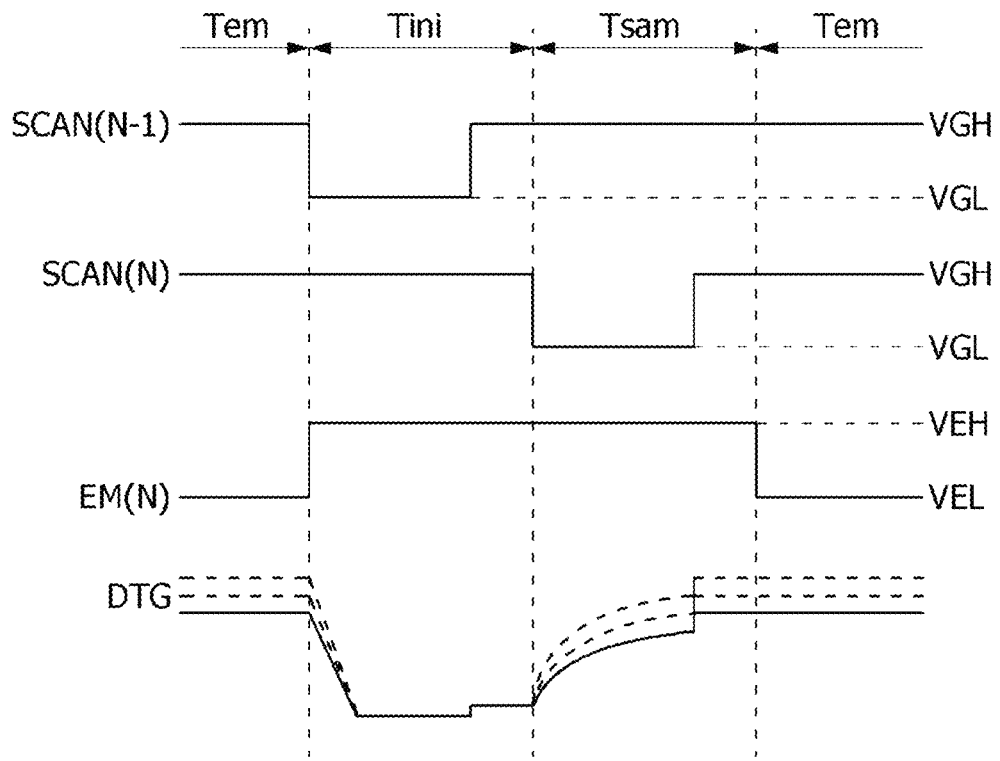
FIG. 8 is a waveform diagram showing a method of driving the pixel circuit shown in FIG. 7.

FIG. 7 is a circuit diagram showing an example of a pixel circuit to which an internal compensation circuit is applied. FIG. 8 is a waveform diagram showing a method of driving the pixel circuit shown in FIG. 7.

Referring to FIGS. 7 and 8, the pixel circuit includes the light emitting element OLED, the driving element DT for supplying a current to the light emitting element OLED, and a switch circuit for switching voltages applied to the light emitting element OLED and the driving element DT.

The switch circuit is connected to power lines PL1, PL2, and PL3 to which the pixel driving voltage ELVDD, a low potential power voltage ELVSS, and an initialization voltage Vini are applied, the data line DL, and gate lines GL1, GL2, and GL3, and switches the voltages applied to the light emitting element OLED and the driving element DT in response to scan pulses SCAN(N-1) and SCAN(N) and an EM pulse EM(N).

The switch circuit includes the internal compensation circuit that samples, using a plurality of switch elements M1 to M6, a threshold voltage Vth of the driving element DT to store it in a capacitor Cst1 and compensates the gate voltage of the driving element DT by the threshold voltage Vth of the driving element DT. Each of the driving element DT and the switch elements M1 to M6 may be implemented with a p-channel TFT.

The driving period of the pixel circuit may be divided, as shown in FIG. 8, into an initialization period Tini, a sampling period Tsam, and a light emission period Tem.

An Nth scan pulse SCAN(N) is generated as the gate-on voltage VGL during the sampling period Tsam and is applied to a first gate line GL1. An (N-1)th scan pulse SCAN(N-1) is generated as the gate-on voltage VGL during the initialization period Tini prior to the sampling period and is applied to a second gate line GL2. The EM pulse EM(N) is generated as the gate-off voltage VGH during the initialization period Tini and the sampling period Tsam, and is applied to a third gate line GL3.

During the initialization period Tini, the (N-1)th scan pulse SCAN(N-1) is generated as the gate-on voltage VGL, and the voltage of each of the Nth scan pulse SCAN(N) and the EM pulse EM(N) is the gate-off voltage VGH. During the sampling period Tsam, the Nth scan pulse SCAN(N) is generated as the pulse of the gate-on voltage VGL, and the voltage of each of the (N-1)th scan pulse SCAN(N-1) and the EM pulse EM(N) is the gate-off voltage VGH. During at least a part of the light emission period Tem, the EM pulse EM(N) is generated as the gate-on voltage VGL, and the voltage of each of the (N-1)th scan pulse SCAN(N-1) and the Nth scan pulse SCAN(N) is the gate-off voltage VGH.

During the initialization period Tini, a fifth switch element M5 is turned on in response to the gate-on voltage VGL of the (N-1)th scan pulse SCAN(N-1) to initialize the pixel circuit. During the sampling period Tsam, first and second switch elements M1 and M2 are turned on in response to the gate-on voltage VGL of the Nth scan pulse SCAN(N), so that a data voltage Vdata compensated by the threshold voltage of the driving element DT is stored in the capacitor Cst1. At the same time, a sixth switch element M6 is turned on during the sampling period Tsam to lower the voltage of a fourth node n4 to a reference voltage VREF, thereby suppressing light emission of the light emitting element OLED.

During the light emission period Tem, third and fourth switch elements M3 and M4 are turned on, so that the light emitting element OLED emits light. During the light emission period Tem, in order to accurately express the luminance of low grayscale, the voltage level of the EM pulse EM(N) may be inverted at a predetermined (or selected) duty ratio between the gate-on voltage VGL and the gate-off voltage VGH. In this case, the third and fourth switch elements M3 and M4 may repeatedly turn on/off at the duty ratio of the EM pulse EM(N) during the light emission period Tem.

The anode electrode of the light emitting element OLED is connected to the fourth node n4 between the fourth and sixth switch elements M4 and M6. The fourth node n4 is connected to the anode of the light emitting element OLED, the second electrode of the fourth switch element M4, and the second electrode of the sixth switch element M6. The cathode electrode of the light emitting element OLED is connected to the VSS line PL3 to which the low potential power voltage ELVSS is applied. The light emitting element OLED emits light by a current Ids flowing according to the gate-source voltage Vgs of the driving element DT. The current path of the light emitting element OLED is switched by the third and fourth switch elements M3 and M4.

The capacitor Cst1 is connected between a VDD line PL1 and a second node n2. The data voltage Vdata compensated by the threshold voltage Vth of the driving element DT is charged in the capacitor Cst1. Since the data voltage Vdata is compensated by the threshold voltage Vth of the driving element DT in each of the sub-pixels, deviation in the electrical properties of the driving element DT is compensated in the sub-pixels.

The first switch element M1 is turned on in response to the gate-on voltage VGL of the Nth scan pulse SCAN(N) to connect the second node n2 to a third node n3. The second node n2 is connected to the gate electrode of the driving element DT, the first electrode of the capacitor Cst1, and the first electrode of the first switch element M1. The third node n3 is connected to the second electrode of the driving element DT, the second electrode of the first switch element M1, and the first electrode of the fourth switch element M4. The gate electrode of the first switch element M1 is connected to the first gate line GL1 to receive the Nth scan pulse SCAN(N). The first electrode of the first switch element M1 is connected to the second node n2, and the second electrode of the first switch element M1 is connected to the third node n3.

Since the first switch element M1 is turned on only for one horizontal period 1H, which is very short, in which the Nth scan pulse SCAN(N) is generated as the gate-on voltage VGL in one frame period, a leakage current may occur in the off state. In order to suppress the leakage current in the first switch element M1, the first switch element M1 may be implemented with a transistor having a dual gate structure in which two transistors are connected in series.

The second switch element M2 is turned on in response to the gate-on voltage VGL of the Nth scan pulse SCAN(N) to supply the data voltage Vdata to a first node n1. The gate electrode of the second switch element M2 is connected to the first gate line GL1 to receive the Nth scan pulse SCAN(N). The first electrode of the second switch element M2 is connected to the first node n1. The second electrode of the second switch element M2 is connected to the data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the EM pulse EM(N) to connect the VDD line PL1 to the first node n1. The gate electrode of the third switch element M3 is connected to the third gate line GL3 to receive the EM pulse EM(N). The first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to connect the third node n3 to the anode electrode of the light emitting element OLED. The gate electrode of the fourth switch element M4 is connected to the third gate line GL3 to receive the EM pulse EM(N). The first electrode of the fourth switch element M4 is connected to the third node n3, and the second electrode thereof is connected to the fourth node n4.

The fifth switch element M5 is turned on in response to the gate-on voltage VGL of the (N-1)th scan pulse SCAN(N-1) to connect the second node n2 to the Vini line PL2. The gate electrode of the fifth switch element M5 is connected to the second gate line GL2 to receive the (N-1)th scan pulse SCAN(N-1). The first electrode of the fifth switch element M5 is connected to the second node n2, and the second electrode thereof is connected to the Vini line PL2. In order to suppress a leakage current in the fifth switch element M5, the fifth switch element M5 is implemented with a transistor having a dual gate structure in which two transistors are connected in series.

The sixth switch element M6 is turned on in response to the gate-on voltage VGL of the Nth scan pulse SCAN(N) to connect the Vini line PL2 to the fourth node n4. The gate electrode of the sixth switch element M6 is connected to the first gate line GL1 to receive the Nth scan pulse SCAN(N). The first electrode of the sixth switch element M6 is connected to the Vini line PL2, and the second electrode thereof is connected to the fourth node n4.

In another embodiment, the gate electrodes of the fifth and sixth switch elements M5 and M6 may be commonly connected to the second gate line GL2 to which the (N-1)th scan pulse SCAN(N-1) is applied. In this case, the fifth and sixth switch elements M5 and M6 may be simultaneously turned on in response to the (N-1)th scan pulse SCAN(N-1).

The driving element DT drives the light emitting element OLED by controlling a current flowing through the light emitting element OLED according to the gate-source voltage Vgs. The driving element DT includes a gate electrode connected to the second node n2, a first electrode connected to the first node n1, and a second electrode connected to the third node n3.

During the initialization period Tini, the (N-1)th scan pulse SCAN(N-1) is generated as the gate-on voltage VGL. The Nth scan pulse SCAN(N) and the EM pulse EM(N) maintain the gate-off voltage VGH during the initialization period Tini. Accordingly, during the initialization period Tini, the fifth switch element M5 is turned on, so that the second and fourth nodes n2 and n4 are initialized to Vini. A hold period may be set between the initialization period Tini and the sampling period Tsam. During the hold period, the scan pulses SCAN(N-1) and SCAN(N) and the EM pulse EM(N) are the gate-off voltage.

During the sampling period Tsam, the Nth scan pulse SCAN(N) is generated as the gate-on voltage VGL. The pulse of the Nth scan pulse SCAN(N) is synchronized with the data voltage Vdata of a Nth pixel line. The (N-1)th scan pulse SCAN(N-1) and the EM pulse EM(N) maintain the gate-off voltage VGH during the sampling period Tsam. Accordingly, the first and second switch elements M1 and M2 are turned on during the sampling period Tsam.

During the sampling period Tsam, a gate voltage DTG of the driving element DT rises due to a current flowing through the first and second switch elements M1 and M2. When the driving element DT is turned off, the gate voltage DTG is Vdata−|Vth|. In this case, the voltage of the first node n1 is also Vdata−|Vth|. During the sampling period Tsam, the gate-source voltage Vgs of the driving element DT is expressed as |Vgs|=Vdata−(Vdata−|Vth|)=|Vth|.

During the light emission period Tem, the EM pulse EM(N) may be generated as the gate-on voltage VGL. During the light emission period Tem, the voltage of the EM pulse EM(N) may be inverted at a predetermined (or selected) duty ratio. Accordingly, the EM pulse EM(N) may be generated as the gate-on voltage VGL during at least a part of the light emission period Tem.

When the EM pulse EM(N) is the gate-on voltage VGL, a current flows between ELVDD and the light emitting element OLED, so that the light emission element OLED may emit light. During the light emission period Tem, the (N-1)th and Nth scan pulses SCAN(N-1) and SCAN(N) maintain the gate-off voltage VGH. During the light emission period Tem, the third and fourth switch elements M3 and M4 are turned on according to the gate-on voltage of the EM pulse EM(N). When the EM pulse EM(N) is the gate-on voltage VGL, the third and fourth switch elements M3 and M4 are turned on, so that a current flows through the light emitting element OLED. At this time, Vgs of the driving element DT is expressed as |Vgs|=VDD−(Vdata−|Vth|), and the current flowing through the light emitting element OLED is K(VDD−Vdata)$^2$. K is a constant value determined by charge mobility, parasitic capacitance, channel capacity, and the like of the driving element DT.

Figure 9:
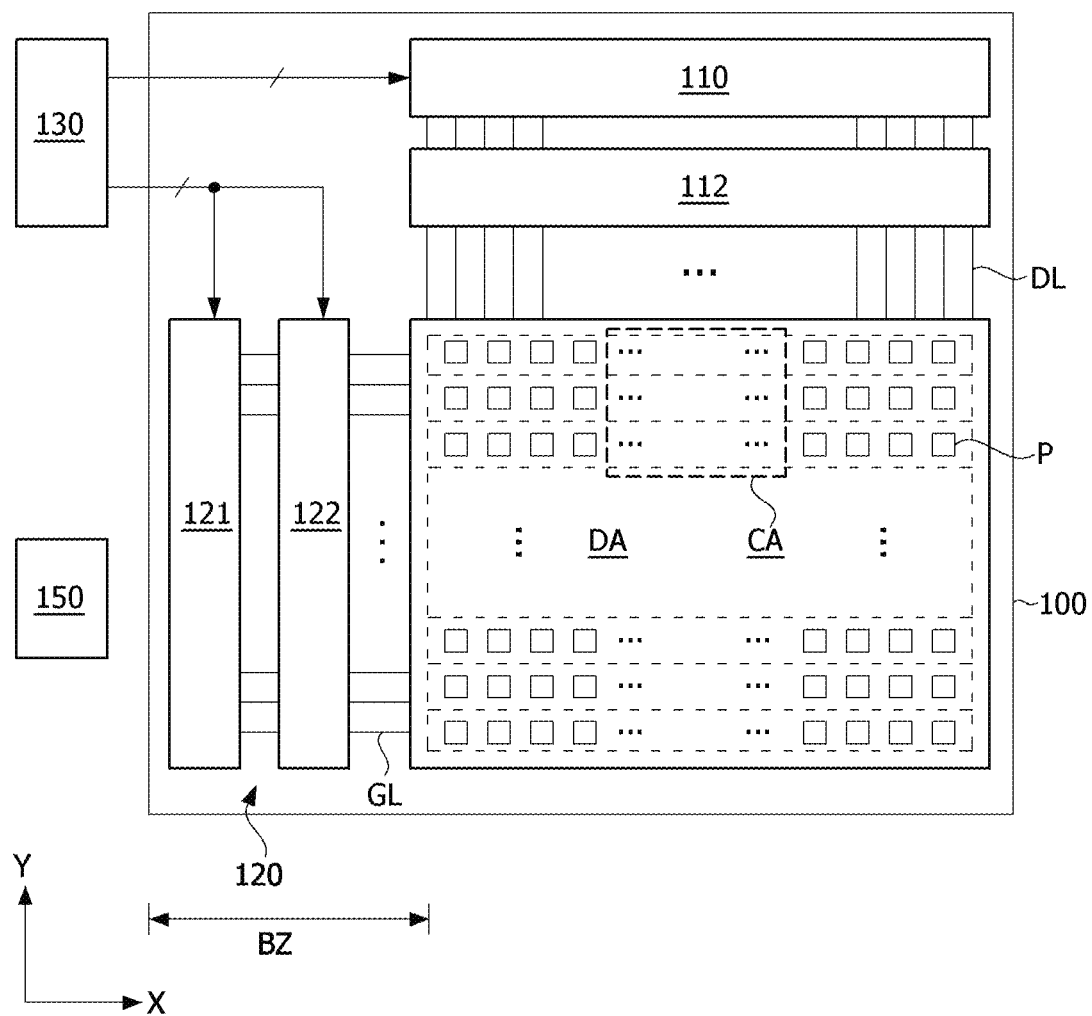
FIG. 9 is a block diagram showing a display device according to an embodiment of the present disclosure.

FIG. 9 is a block diagram showing a display device according to an embodiment of the present disclosure.

Referring to FIG. 9, the display device according to an embodiment of the present disclosure includes the display panel 100 and a display panel driver 110 and 120 for writing the pixel data of the input image to pixels P of the display panel 100, a timing controller 130 for controlling the display panel driver, and a power supply unit 150 for generating power for driving the display panel 100.

The display panel 100 includes a pixel array that displays an input image on a screen. As described above, the pixel array may be divided into the first pixel area DA, and the second pixel area CA having a resolution or PPI lower than that of the first pixel area DA. Since the first pixel area DA includes the pixels P of high resolution and high PPI and thus is larger in size than the second pixel area CA, most of the image information is displayed on the first pixel area DA. Each of the sub-pixels of the pixel array may drive the light emitting element OLED by using the pixel circuits as in FIGS. 5 to 7.

Touch sensors may be disposed on the screen of the display panel 100. The touch sensors may be disposed on the screen of the display panel in an on-cell type or an add-on type, or may be implemented as in-cell type touch sensors that are incorporated in the pixel array.

The display panel 100 may be implemented as a flexible display panel in which the pixels P are arranged on a flexible substrate such as a plastic substrate or a metal substrate. In a flexible display, the size and shape of the screen may be changed by winding, folding, or bending the flexible display panel. The flexible display may include a slideable display, a rollable display, a bendable display, a foldable display, and the like.

The display panel driver may drive the pixels P by applying the internal compensation technique and/or the external compensation technique.

The display panel driver reproduces the input image on the screen of the display panel 100 by writing the pixel data of the input image to the sub-pixels. The display panel driver includes the data driver 110 and the gate driver 120. The display panel driver may further include a demultiplexer 112 disposed between the data driver 110 and the data lines DL.

The display panel driver may operate in a low speed driving mode under the control of the timing controller 130. In the low speed driving mode, the input image is analyzed and when the input image does not change for a preset (or selected) period of time, power consumption of the display device may be reduced. In the low speed driving mode, when a still image is inputted for a certain period of time or over, a refresh rate of the pixels P is lowered to control the data writing period of the pixels P to be longer, thereby reducing the power consumption. The low speed driving mode is not limited to when a still image is inputted. For example, when the display device operates in a standby mode or when a user command or an input image is not inputted to a display panel driver for a predetermined (or selected) period of time or over, the display panel driver may operate in the low speed driving mode.

The data driver 110 converts the pixel data, which is digital data, of the input image into a gamma compensation voltage using a digital to analog converter (hereinafter referred to as "DAC") to generate the data voltage Vdata. The data driver 110 may include a voltage divider circuit that outputs the gamma compensation voltage. The voltage divider circuit divides a gamma reference voltage from the power supply unit 150 to generate the gamma compensation voltage for each grayscale, and provides it to the DAC. The DAC may convert the pixel data or compensation data into the gamma compensation voltage and output the data voltage and a compensation voltage. The data voltage outputted from the channels of the data driver 110 may be supplied to the data lines DL of the display panel 100 through the demultiplexer 112.

The demultiplexer 112 time-divisionally distributes the data voltage Vdata outputted through the channels of the data driver 110 to the plurality of data lines DL. The number of channels of the data driver 110 may be reduced due to the demultiplexer 112. The demultiplexer 112 may be omitted. In this case, the channels of the data driver 110 are directly connected to the data lines DL.

The gate driver 120 may be implemented in a gate in panel (GIP) circuit formed directly on a bezel region BZ of the display panel 100 together with a TFT array of the pixel array. The gate driver 120 outputs a gate signal to the gate lines GL under the control of the timing controller 130. The gate driver 120 may shift the gate signal using a shift register to sequentially supply the gate signal to the gate lines GL. The voltage of the gate signal swings between the gate-off voltage VGH and the gate-on voltage VGL. The gate signal may include the scan pulse, the EM pulse, the sensing pulse, which are shown in FIGS. 5 to 7, and the like.

The gate driver 120 may be disposed on each of left and right bezels of the display panel 100 to supply the gate signal to the gate lines GL in a double feeding method. In the double feeding method, the gate drivers 120 on both sides are synchronized, so that the gate signal may be simultaneously applied to both ends of one gate line. In another embodiment, the gate driver 120 may be disposed on one of the left and right bezels of the display panel 100 to supply the gate signal to the gate lines GL in a single feeding method.

The gate driver 120 may include a first gate driver 121 and a second gate driver 122. The first gate driver 121 outputs the scan pulse and the sensing pulse, and shifts the scan pulse and the sensing pulse according to a shift clock. The second gate driver 122 outputs the EM signal and shifts the EM pulse according to a shift clock. In the case of a model having no bezel, at least some of the switch elements constituting the first and second gate drivers 121 and 122 may be distributedly disposed in the pixel array.

The timing controller 130 receives the pixel data of the input image and a timing signal synchronized with the pixel data from the host system. The timing signal includes a vertical synchronization signal Vsync, a horizontal synchronization signal Hsync, a clock CLK, a data enable signal DE, and the like. One period of the vertical synchronization signal Vsync is one frame period. One period of the horizontal synchronization signal Hsync and the data enable signal DE is one horizontal period 1H. The pulse of the data enable signal DE is synchronized with one line data to be written to the pixels P of one pixel line. Since the frame period and the horizontal period may be known by counting the data enable signal DE, the vertical synchronization signal Vsync and the horizontal synchronization signal Hsync may be omitted.

The timing controller 130 transmits the pixel data of the input image to the data driver 110 and synchronizes the data driver 110, the demultiplexer 112, and the gate driver 120. The timing controller 130 may include a data operation unit that receives sensing data obtained from the pixels P from the display panel driver to which the external compensation technique is applied and modulates the pixel data. In this case, the timing controller 130 transmits the pixel data modulated by the data operation unit to the data driver 110.

The timing controller 130 may multiply an input frame frequency by i (i being a positive integer greater than 0) to control the operation timing of the display panel driver 110, 112, and 120 at a frame frequency of the input frame frequency×i Hz. The input frame frequency is 60 Hz in a National Television Standards Committee (NTSC) system and 50 Hz in a Phase-Alternating Line (PAL) system. The timing controller 130 may lower the frame frequency to a frequency between 1 Hz and 30 Hz in order to lower the refresh rate of the pixels P in the low speed driving mode.

The timing controller 130 generates a data timing control signal for controlling the operation timing of the data driver 110, a switch control signal for controlling the operation timing of the demultiplexer 112, and a gate timing control signal for controlling the operation timing of the gate driver 120, based on the timing signals Vsync, Hsync, and DE received from the host system.

The gate timing control signal may include a start pulse, a shift clock, and the like. The voltage level of the gate timing control signal outputted from the timing controller 130 may be converted into the gate-off voltage VGH/VEH or the gate-on voltage VGL/VEL through a level shifter omitted from the drawing and may be supplied to the gate driver 120. The level shifter may convert a low level voltage of the gate timing control signal into the gate-on voltage VGL, and may convert a high level voltage of the gate timing control signal into the gate-off voltage VGH.

The power supply unit 150 may include a charge pump, a regulator, a buck converter, a boost converter, a programmable gamma IC (P-GMA IC), and the like. The power supply unit 150 generates power for driving the display panel driver and the display panel 100 by adjusting a DC input voltage from the host system. The power supply unit 150 may output DC voltages such as the gamma reference voltage, the gate-off voltage VGH/VEH, the gate-on voltage VGL/VEL, the pixel driving voltage ELVDD, the low potential power voltage ELVSS, the initialization voltage Vini, and the reference voltage VREF. The programmable gamma IC may vary the gamma reference voltage depending on a register setting value. The gamma reference voltage is supplied to the data driver 110. The gate-off voltage VGH/VEH and the gate-on voltage VGL/VEL are supplied to the level shifter and the gate driver 120. The pixel driving voltage ELVDD, the low potential power voltage ELVSS, the initialization voltage Vini, and the reference voltage VREF are commonly supplied to the pixel circuits through the power lines. The pixel driving voltage ELVDD is set to a voltage higher than the low potential power voltage ELVSS, the initialization voltage Vini, and the reference voltage VREF.

Figure 10:
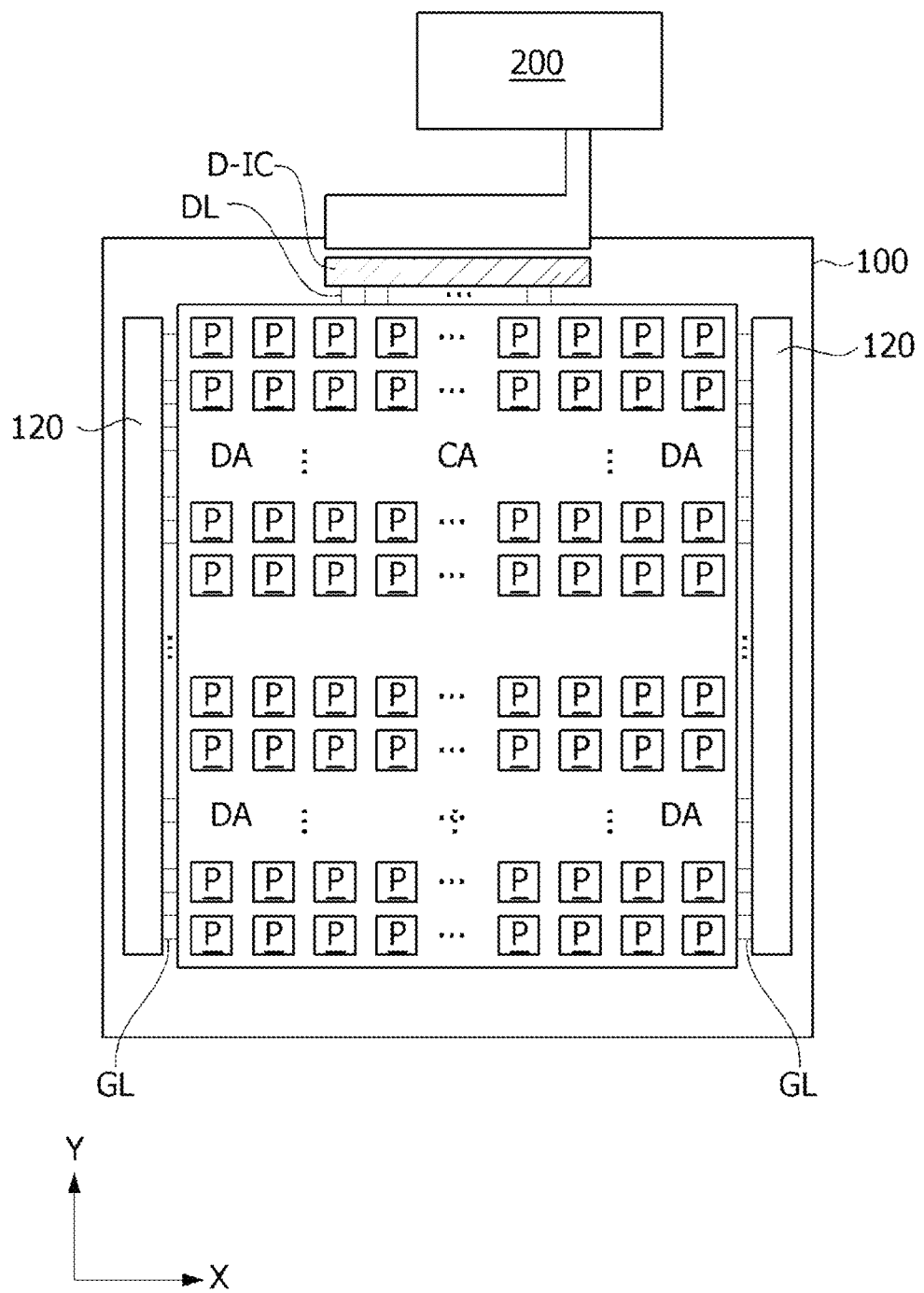
FIG. 10 is a diagram showing an example in which a display device according to an embodiment of the present disclosure is applied to a mobile device.

The host system may be a main circuit board of a television (TV) system, a set-top box, a navigation system, a personal computer (PC), a vehicle system, a home theater system, a mobile device, or a wearable device. In the mobile device or the wearable device, the timing controller 130, the data driver 110, and the power supply unit 150 may be integrated into one drive integrated circuit (D-IC) as shown in FIG. 10. In FIG. 10, reference numeral "200" denotes the host system.

The resolution or PPI of the second pixel area CA is lower than that of the first pixel area DA. For this reason, if the data voltage Vdata applied to the pixels P in the second pixel area CA is equal to the data voltage Vdata applied to the pixels P in the first pixel area DA at the same grayscale, since a luminance L2 of the second pixel area CA is lower than a luminance L1 of the first pixel area DA, a luminance difference between the first pixel area DA and the second pixel area CA may be visually recognized.

Figure 11:
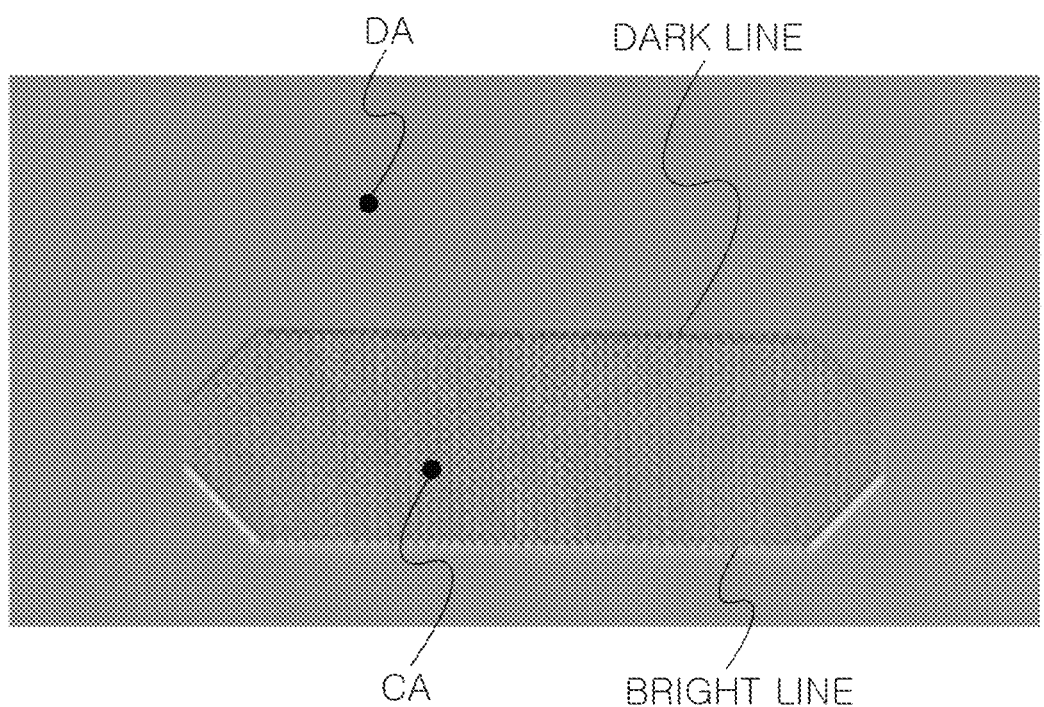
FIG. 11 is a diagram showing an example in which a bright line and a dark line are visible at a boundary line between first and second pixel areas.

In order to compensate for the luminance difference between the first and second pixel areas DA and CA, the data voltage applied to the pixels in the second pixel area CA may be set higher than the data voltage applied to the pixels in the first pixel area DA. When the data voltage applied to the pixels in the second pixel area CA is increased in this way, the maximum luminance of a single pixel in the second pixel area CA may become higher than that of the first pixel area DA. For example, when the PPI of the second pixel area CA is lower than the PPI of the first pixel area DA by ¼ level, the maximum luminance of a single pixel in the second pixel area CA may be four times higher than the maximum luminance of a single pixel in the first pixel area DA. In this case, when all the pixels in the first and second pixel areas DA and CA are turned on with the maximum luminance, the average luminance of the second pixel area CA may become the same as the average luminance of the first pixel area CA. However, depending on the location and number of pixels that are turned on at the boundary line between the first pixel area DA and the second pixel area CA, as shown in FIG. 11, a bright line or a dark line may be seen on the boundary.

In the present disclosure, a boundary pixel area for compensating for the luminance difference (hereinafter referred to as a "third pixel area") is additionally provided at the boundary between the first pixel area DA and the second pixel area CA having different resolutions or PPI, thereby preventing the bright line and dark line visible at the boundary line between the first pixel area DA and the second pixel area CA.

Figure 12:
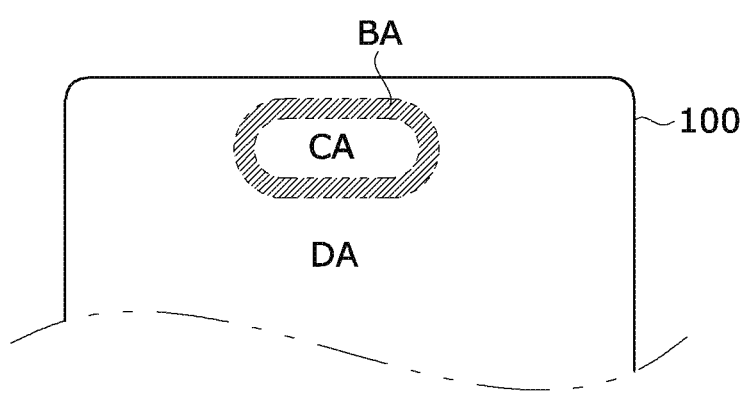
FIG. 12 is a diagram schematically showing a third pixel area between first and second pixel areas.
Figure 14:
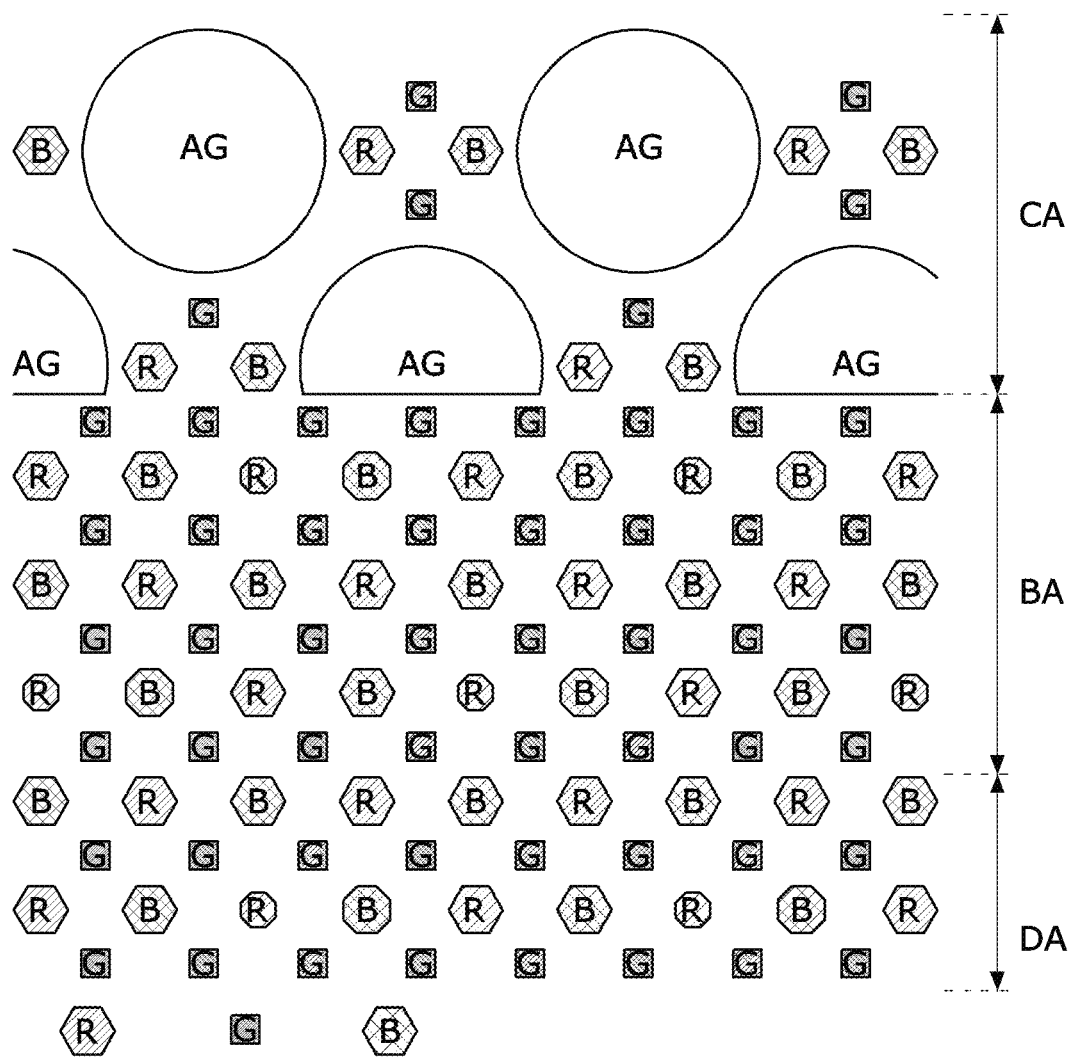
FIG. 14 is a diagram showing pixel arrangements in first to third pixel areas.

FIG. 12 is a diagram schematically showing a third pixel area BA between the first and second pixel areas DA and CA. FIG. 13 is a diagram showing various shapes of the second and third pixel areas CA and BA. FIG. 14 is a diagram showing pixel arrangements in first to third pixel areas DA to BA.

Referring to FIGS. 12 to 14, in the third pixel area BA, pixels are arranged in the same arrangement as those of the first pixel area DA, and the density of pixels is higher than that of the second pixel area CA. Accordingly, the PPI of the third pixel area BA is the same as that of the first pixel area DA and is higher than that of the second pixel area CA.

In the first pixel area DA, an pixel area having a predetermined (or selected) size adjacent to the second pixel area CA may be set as the third pixel area BA. The second pixel area CA is disposed in the third pixel area BA. The third pixel area BA is defined as a pixel area surrounding the second pixel area CA. The boundary line between the second pixel area CA and the third pixel area BA may, as shown in FIG. 13, have a shape of a rectangle, an octagon, a circle, or an ellipse. The boundary line between the first pixel area DA and the third pixel area BA may, as shown in FIG. 13, have a shape of an ellipse, or a circle.

The maximum luminance of the pixels arranged in the first pixel area DA may be substantially the same as the maximum luminance of the pixels arranged in the third pixel area BA. Since the pixels are arranged in the second pixel area CA at a low PPI, the maximum luminance of the pixels arranged in the second pixel area CA may be set higher than the maximum luminance of the pixels arranged in the first and third pixel areas DA and BA.

When an input image is displayed, the third pixel area BA prevents a boundary line between the pixel areas from being seen, and prevents the luminance difference between the pixel areas from being visually recognized. To this end, when an image is displayed in the third pixel area BA, some of all the pixels that can be turned on emit light, so that the pixels are turned on with PPI less than or equal to that of the first pixel area DA and greater than or equal to that of the second pixel area CA. For example, while the PPI of the pixels that are turned on (hereinafter referred to as "ON pixels") in the third pixel area BA during one frame period may be less than the PPI of the first pixel area DA, it may be equal to or greater than the PPI of the second pixel area CA.

In order to prevent a boundary line such as a bright line or a dark line between the pixel areas DA, CA, and BA from being seen, and to reduce the difference in average luminance between the pixel areas, the positions of ON pixels in the third pixel area BA may be changed at a predetermined (or selected) time period. For example, the positions of the ON pixels in the third pixel area BA may be shifted every frame period. This will be described in detail with reference to FIGS. 15 to 22.

Figure 15:
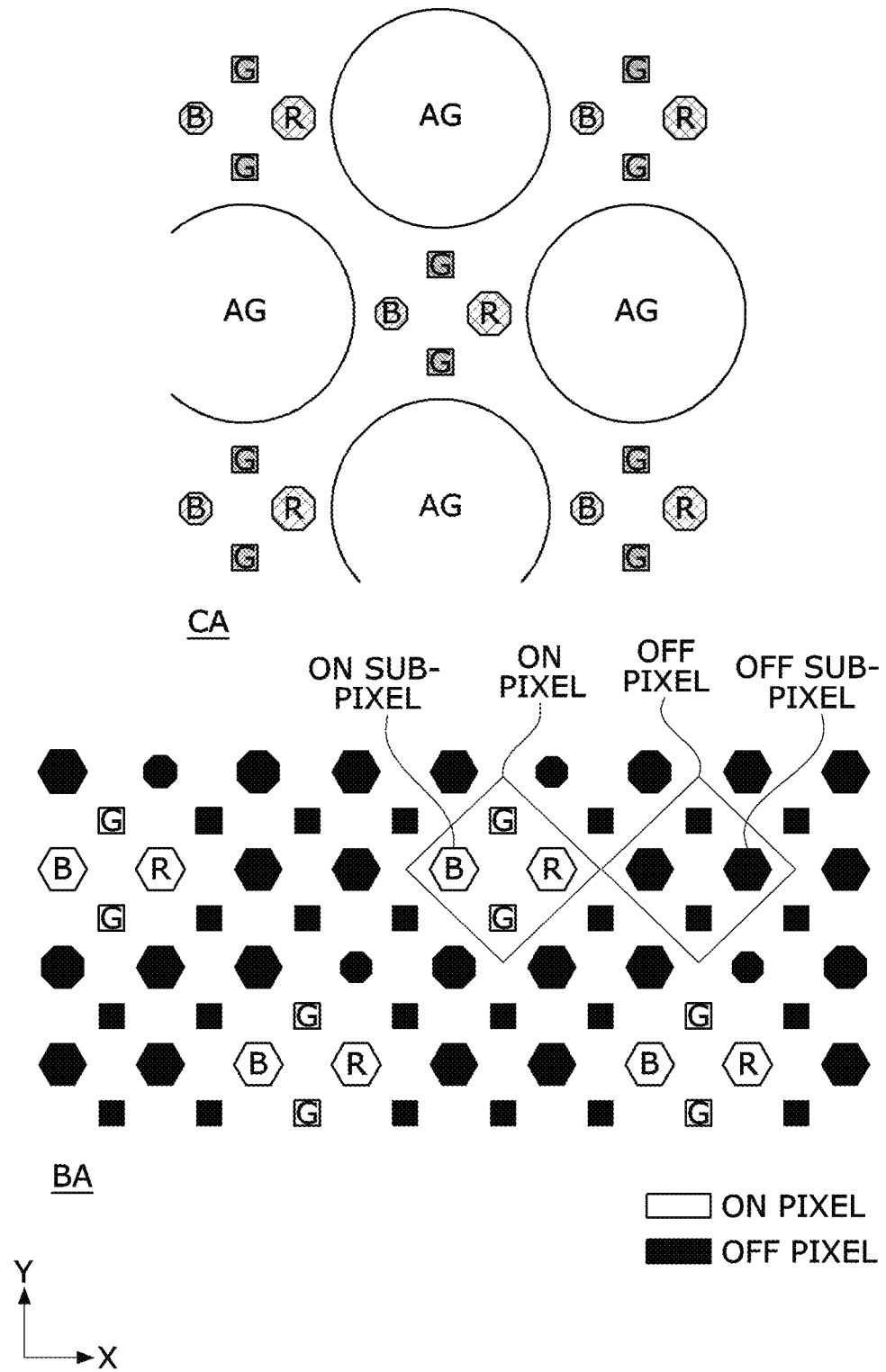
FIGS. 15 and 16 are diagrams showing an example of ON pixels that are turned on in a third pixel area.
Figure 16:
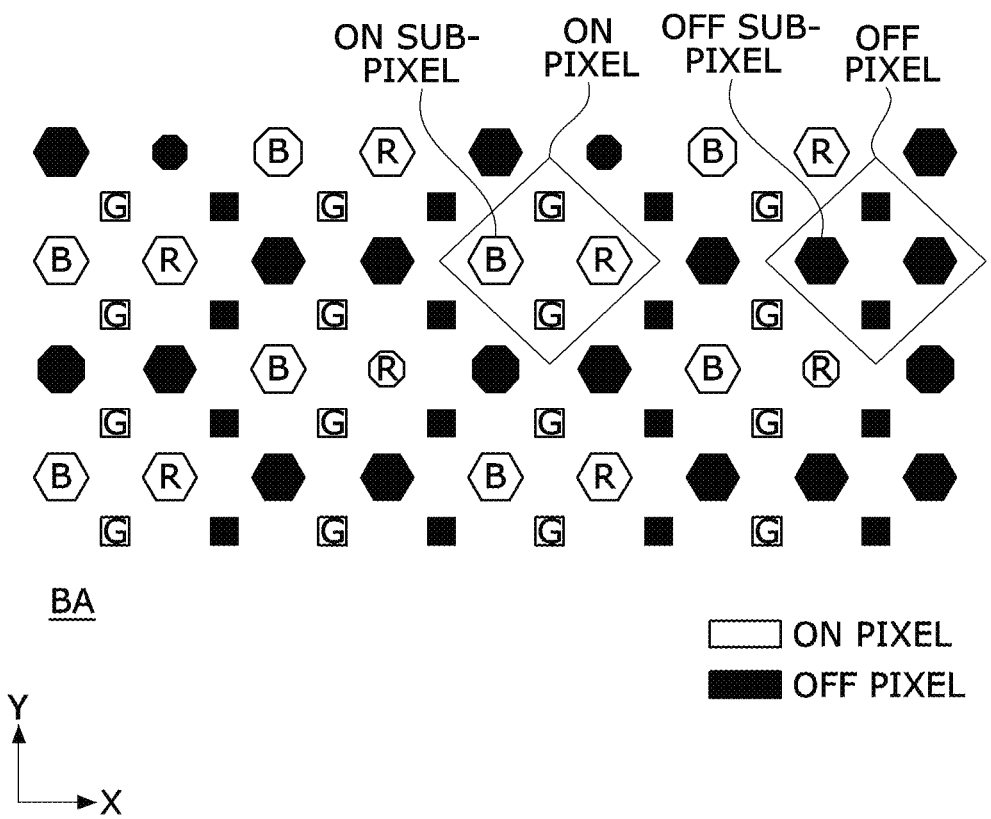

FIGS. 15 and 16 are diagrams showing an example of pixels that are turned on in the third pixel area BA.

The PPI of the third pixel area BA is the same as that of the first pixel area DA. In order to prevent the boundary line between the pixel areas from being seen and prevent the luminance difference between the first and second pixel areas DA and CA from being visually recognized, some of the pixels in the third pixel area BA may be selected as ON pixels and may emit light at a luminance defined by a grayscale value of pixel data. The ON pixels may be selected on a pixel group PG basis. Each of the ON pixels may include two or three ON sub-pixels to which pixel data is written. The pixel group PG may include one or two ON pixels to which pixel data is written, or may include two to four ON sub-pixels to which pixel data is written.

As shown in FIG. 15, 25% of the pixel groups PG among the pixels in the third pixel area BA may be selected as ON pixels. In this case, the PPI of the third pixel area BA is reduced to ¼ of the PPI including all pixels that can be turned on. As shown in FIG. 16, 50% of the pixel groups PG among the pixels in the third pixel area BA may be selected as ON pixels. In this case, the PPI of the third pixel area BA is reduced to ½. When the PPI of the third pixel area BA decreases, the pixel groups PG including ON pixels are spaced apart at equal intervals with one or more sub-pixels interposed therebetween.

The PPI of the third pixel area BA may vary depending on the average luminance of the input image. For example, when the average luminance of the input image is high, 75% to 100% of all pixels that can be turned on in the third pixel area BA may be driven as ON pixels. When the average luminance of the input image is relatively low, 25% to 75% of all pixels that can be turned on in the third pixel area BA may be driven as ON pixels.

When the pixels in the third pixel area BA are driven with low PPI, the remaining pixels (hereinafter referred to as "background pixels") other than the ON pixels in the third pixel area BA may be turned off or driven with low luminance. Hereinafter, among the background pixels, pixels that are turned off are referred to as "OFF pixels," and pixels that are turned on with low luminance are referred to as "low luminance pixels." The ON pixel and the low luminance pixel may emit light by the pixel data of the input image being written thereto. The OFF pixel does not emit light since no pixel data is written thereto. The ON pixel includes ON sub-pixels. The OFF pixel includes OFF sub-pixels. The low luminance pixel includes low luminance sub-pixels.

The host system 200 or the timing controller 130 may include a boundary pixel area control unit. The boundary pixel area control unit selects ON pixels and OFF pixels in the third pixel area BA and controls their luminance.

The boundary pixel area control unit may adjust the luminance of the ON pixels and the low luminance pixels by multiplying pixel data to be written into the ON pixels and the low luminance pixels among the pixels in the third pixel area BA by a gain. The boundary pixel area control unit may change the grayscale value of the pixel data, which will be written into the OFF pixels of the third pixel area BA, to a black grayscale value, e.g., "0 (zero)," and may control the display panel driver so that the data having the black grayscale is written into the OFF pixels. The boundary pixel area control unit may change the luminance of the ON pixels and low luminance pixels in the third pixel area BA according to the luminance characteristics of the input image and the driving mode of the display device.

The boundary pixel area control unit may select ON pixels in the third pixel area BA shown in FIGS. 15 to 22 and shift the positions of the ON pixels every frame period according to a preset (or selected) sequence. The ON pixels charge the data voltage of the pixel data and emit light at a luminance corresponding to the grayscale value of the pixel data. The pixel groups PG including ON pixels are turned on in the third pixel area BA. The ON pixels are grouped into the pixel group PG. Each of the pixel groups PG that are turned on includes one or two ON pixels, or includes two to four ON sub-pixels. The pixel groups that are turned on (hereinafter, referred to as "ON pixel groups") are spaced apart from each other with one or more OFF sub-pixels interposed therebetween.

FIGS. 17 to 22 are diagrams showing examples in which positions of pixels that are turned on in the third pixel area BA are shifted at a predetermined (or selected) time period.

Figure 17:
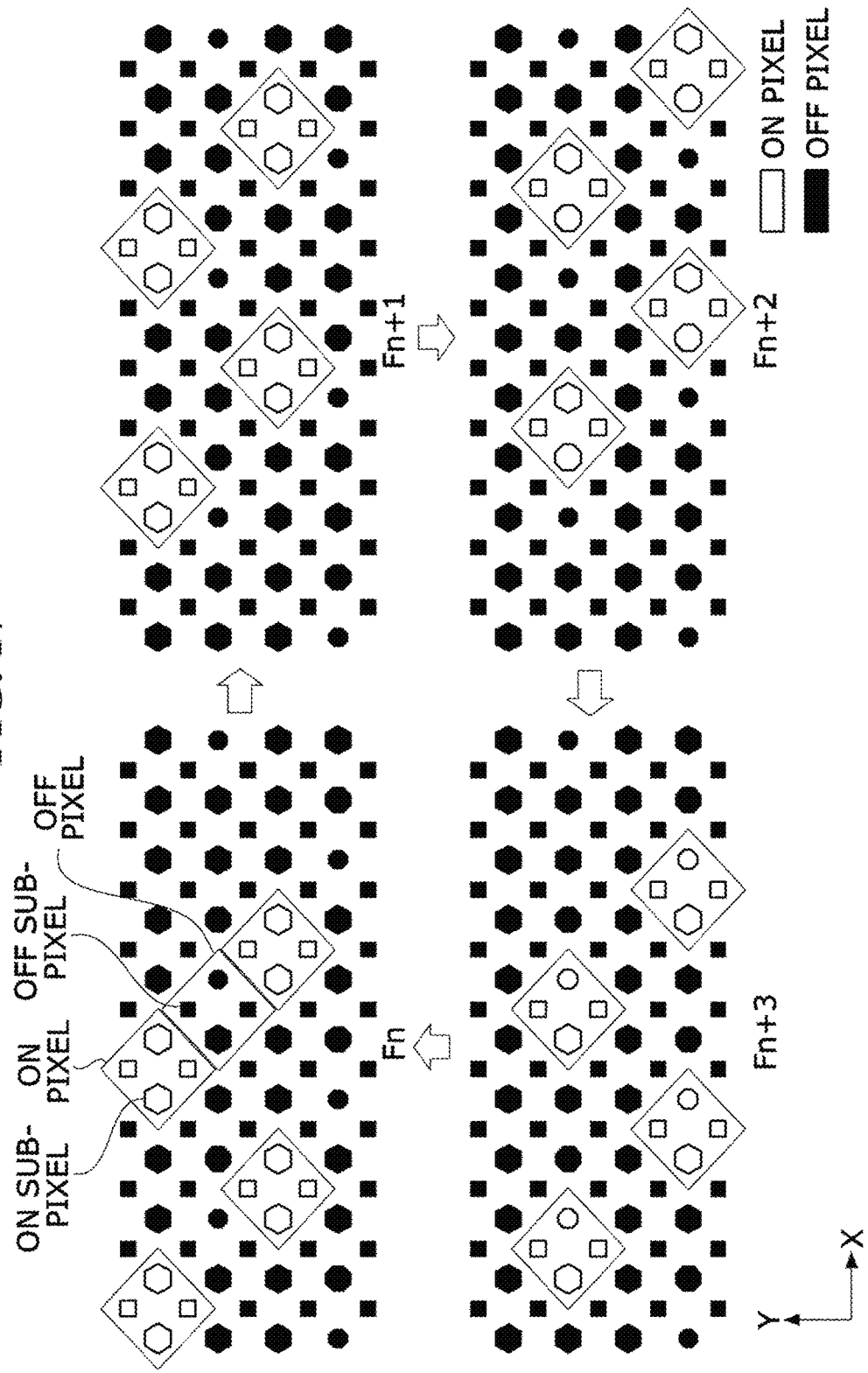
FIGS. 17 to 22 are diagrams showing examples in which positions of ON pixels that are turned on in a third pixel area are shifted at a predetermined (or selected) time period.

Referring to FIG. 17, the boundary pixel area control unit may select 25%, i.e., ¼ of the pixels in the third pixel area BA as ON pixels, and may shift the positions of the ON pixels by 1 pixel group every frame period.

During an $n^{th}$ (n being a natural number) frame period Fn, the ON pixels are turned on in the third pixel area BA to display the pixel data. The ON pixels of ¼ PPI among all the pixels that can be turned on in the third pixel area BA are driven during the $n^{th}$ frame period Fn.

During an $(n+1)^{th}$ frame period Fn+1, the ON pixels are shifted to the left by one pixel group or two dots (or sub-pixels). The ON pixels that have been turned on during the $n^{th}$ frame period Fn are controlled to be turned off as OFF pixels in the $(n+1)^{th}$ frame period Fn+1. During the $(n+1)^{th}$ frame period Fn+1, the ON pixels of ¼ PPI in the third pixel area BA are turned on to display the pixel data.

During an $(n+2)^{th}$ frame period Fn+2, the ON pixels are shifted downward by one pixel group or two dots. The ON pixels that have been turned on during the $(n+1)^{th}$ frame period Fn+1 are controlled to be turned off as OFF pixels in the $(n+2)^{th}$ frame period Fn+2. During the $(n+2)^{th}$ frame period Fn+2, the ON pixels of ¼ PPI in the third pixel area BA are turned on to display the pixel data.

During an $(n+3)^{th}$ frame period Fn+3, the ON pixels are shifted to the right by one pixel group or two dots. The ON pixels that have been turned on during the $(n+2)^{th}$ frame period Fn+2 are controlled to be turned off as OFF pixels in the $(n+3)^{th}$ frame period Fn+3. During the $(n+3)^{th}$ frame period Fn+3, the ON pixels of ¼ PPI in the third pixel area BA are turned on to display the pixel data.

During an $(n+4)^{th}$ frame period, the positions of the ON pixels are controlled in the same manner as in the $n^{th}$ frame period Fn. Thus, the ON pixels in this embodiment rotate clockwise every frame period. Since the ON pixels move every frame period, the OFF pixels are not recognized in the third pixel area BA, and the boundary line between the pixel areas is not visible. Since pixels of ¼ PPI among the pixels in the third pixel area BA are driven, the luminance difference between the second and third pixel areas CA and BA due to a PPI difference may be reduced.

Figure 18:
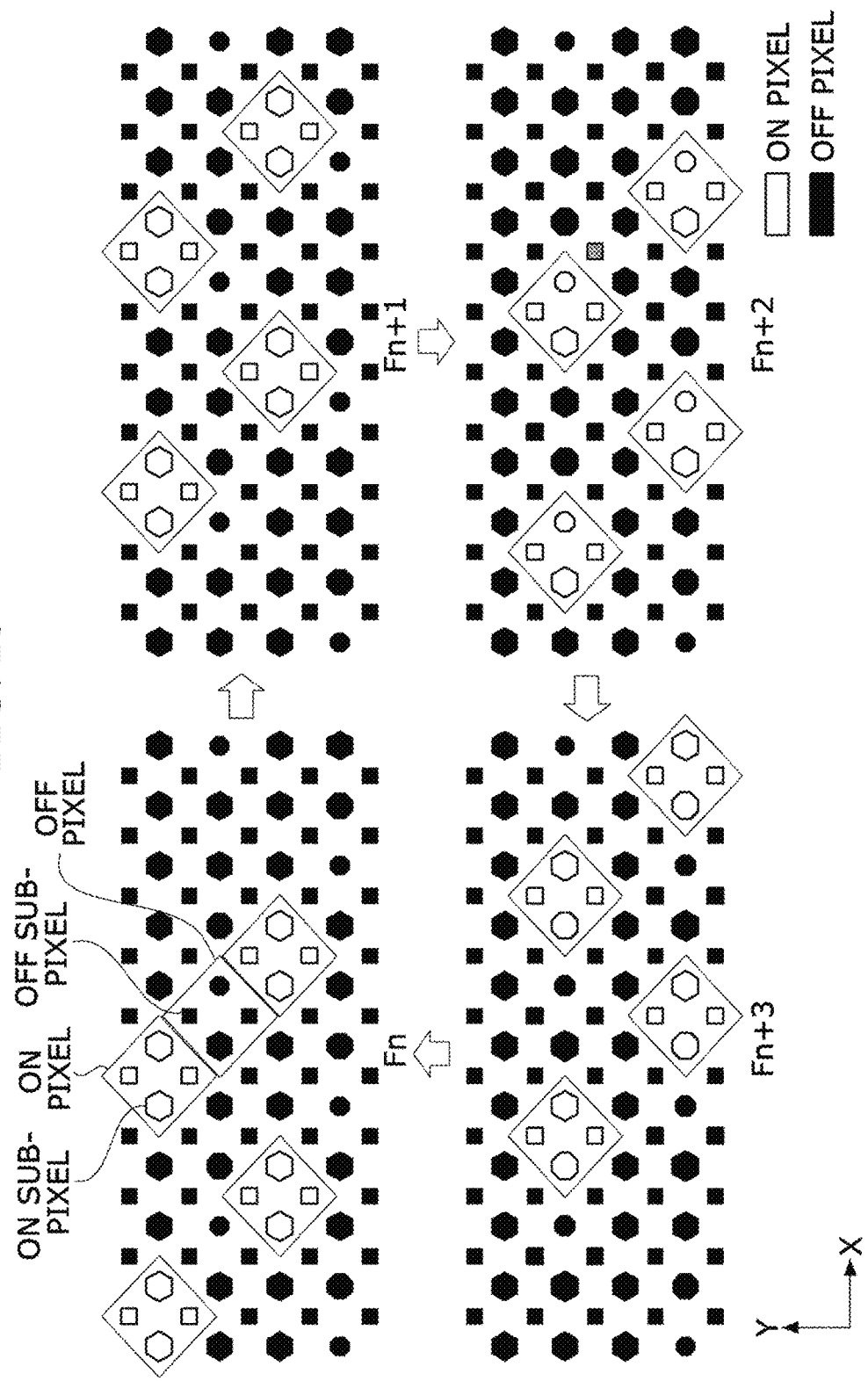
Figure 19:
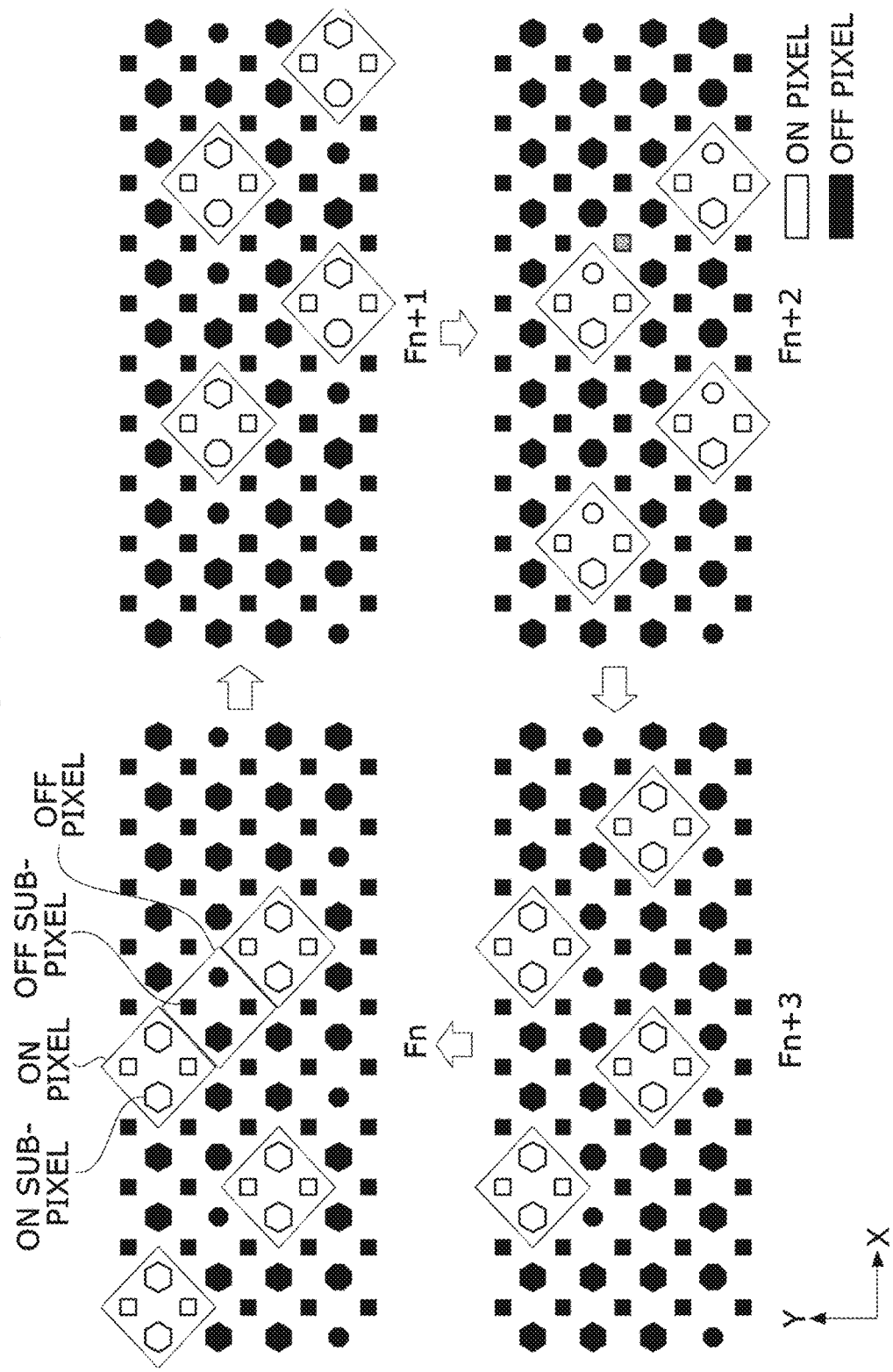

Referring to FIGS. 18 and 19, the boundary pixel area control unit drives the third pixel area BA with ¼ PPI every frame period, but shifts the positions of the ON pixels by one pixel group in a zigzag direction every frame period.

For example, as shown in FIG. 18, the positions of the ON pixels are shifted in the right direction during the $(n+1)^{th}$ frame period Fn+1, and shifted in the lower left direction during the $(n+2)^{th}$ frame period Fn+2. Subsequently, the positions of the ON pixels are shifted in the right direction again during the $(n+3)^{th}$ frame period Fn+3, and shifted in the upper left direction during the $(n+4)^{th}$ frame period to be restored to the positions of the $n^{th}$ frame period.

As shown in FIG. 19, the positions of the ON pixels are shifted in the lower right direction during the $(n+1)^{th}$ frame period Fn+1, and shifted in the left direction during the $(n+2)^{th}$ frame period Fn+2. Subsequently, the positions of the ON pixels are shifted in the upper right direction again during the $(n+3)^{th}$ frame period Fn+3, and shifted in the left direction during the $(n+4)^{th}$ frame period to be restored to the positions of the $n^{th}$ frame period.

Figure 20:
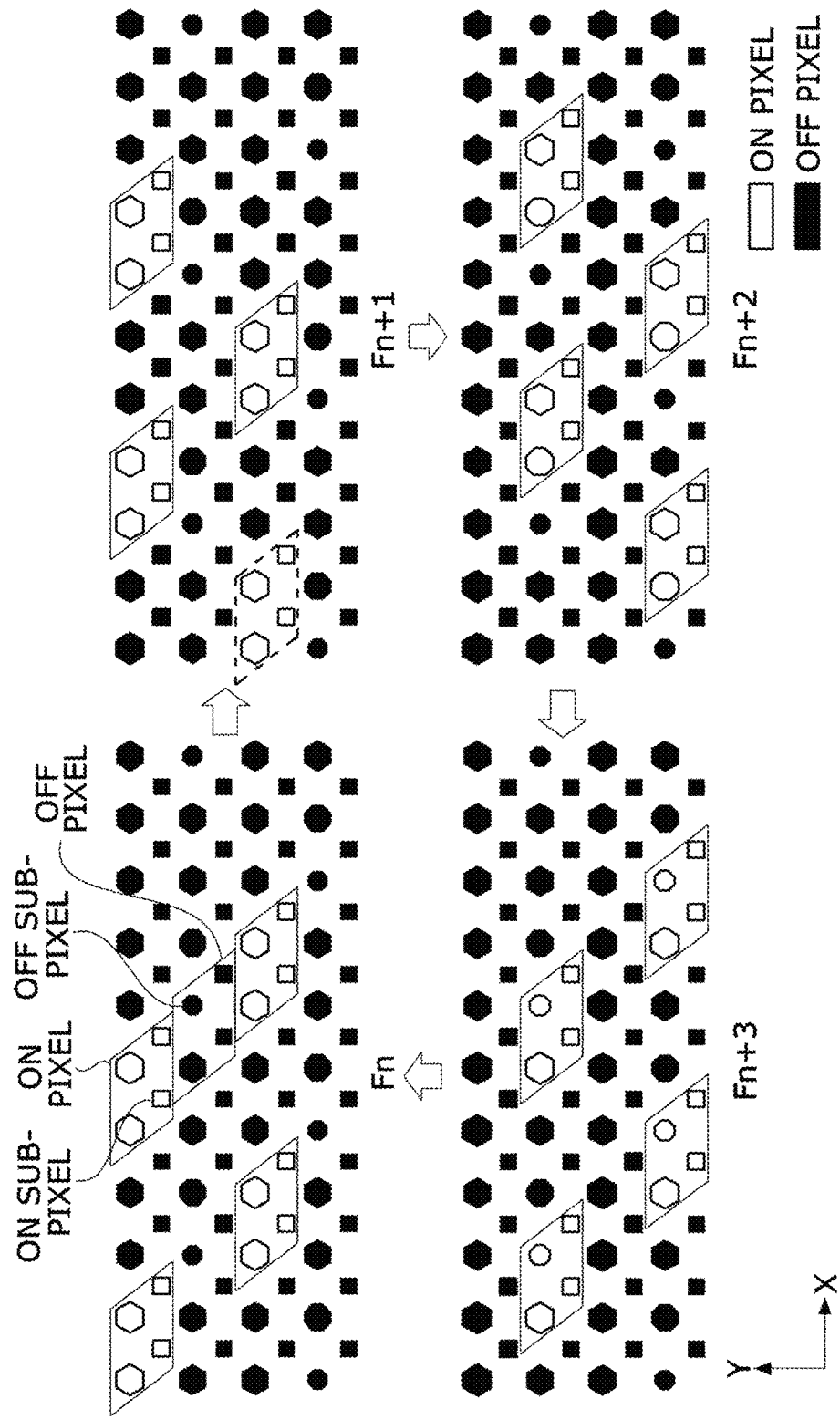

The pixel group PG including ON pixels may be set to have a parallelogrammic shape, as shown in FIG. 20. The position of the pixel group PG may be shifted every frame period according to a preset (or selected) sequence as shown in FIGS. 17 to 19.

Figure 21:
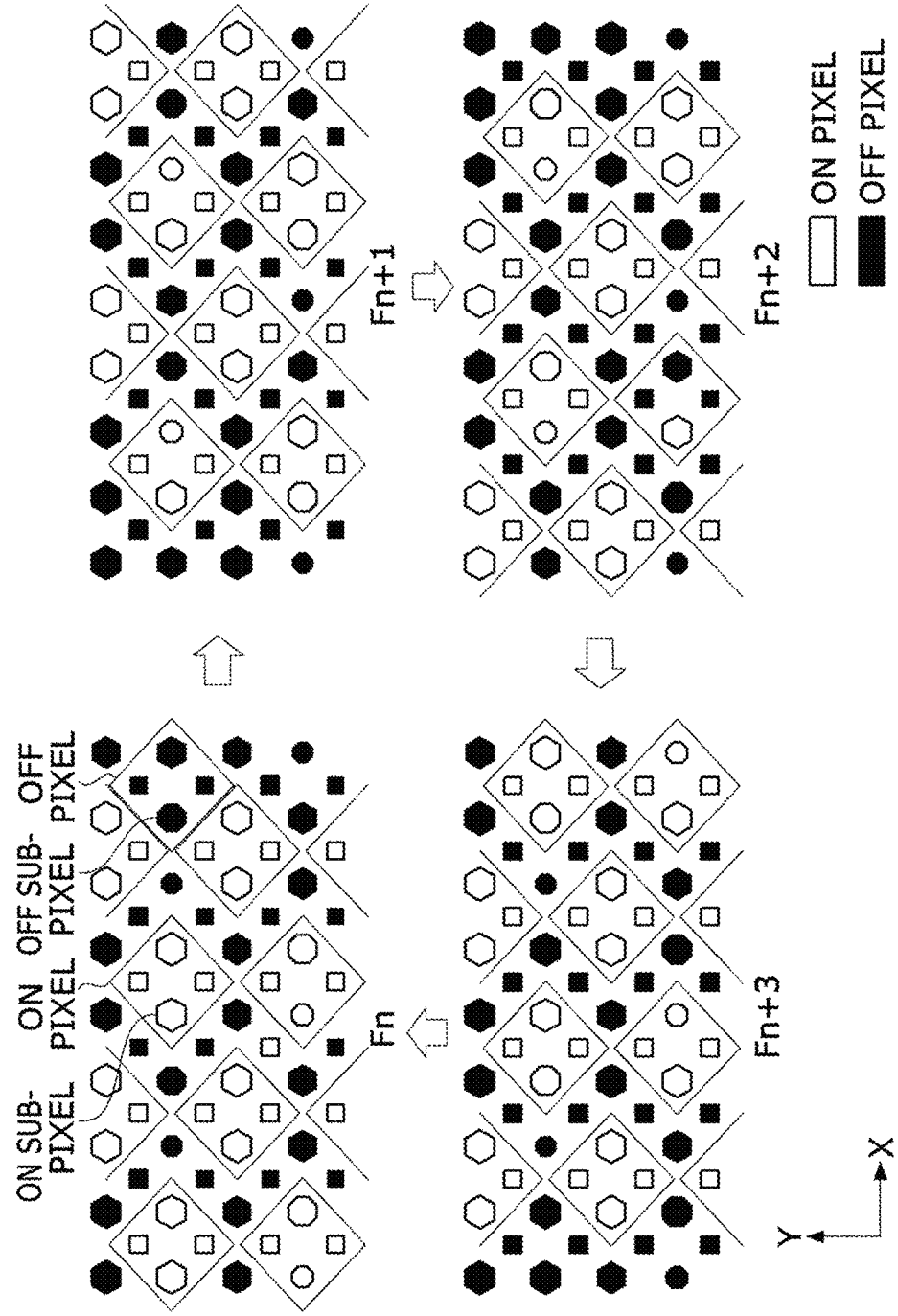
Figure 22:
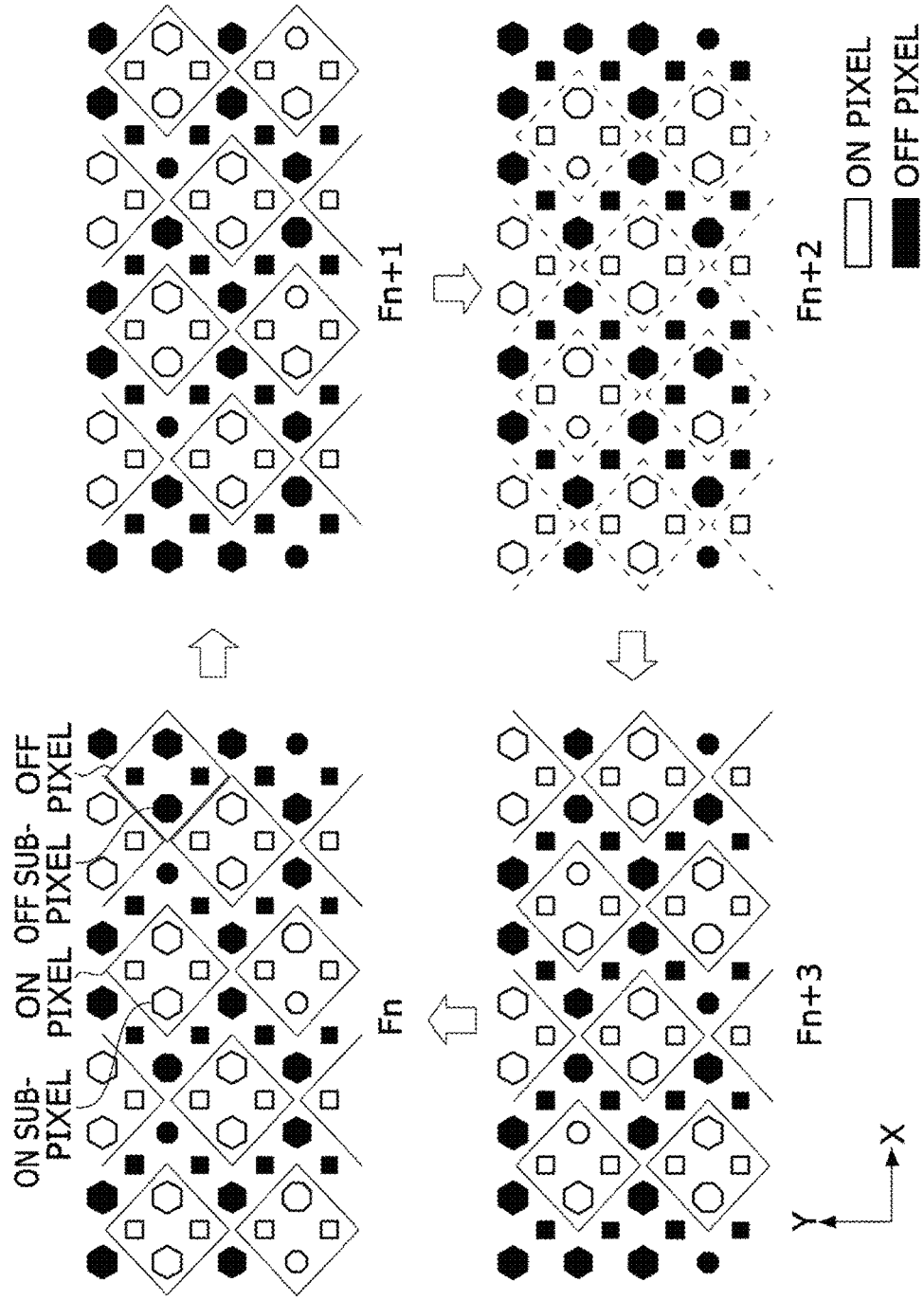

Referring to FIGS. 21 and 22, the boundary pixel area control unit may select 50%, i.e., ½ of the pixels in the third pixel area BA as ON pixels, and may shift the positions of the ON pixels every frame period. The pixel group PG including ON pixels may be a rhombic or parallelogrammic pixel group. The position of the pixel group may be rotated along a circular, elliptical, or zigzag direction by being shifted by a preset (or selected) movement width every frame period.

Figure 23:
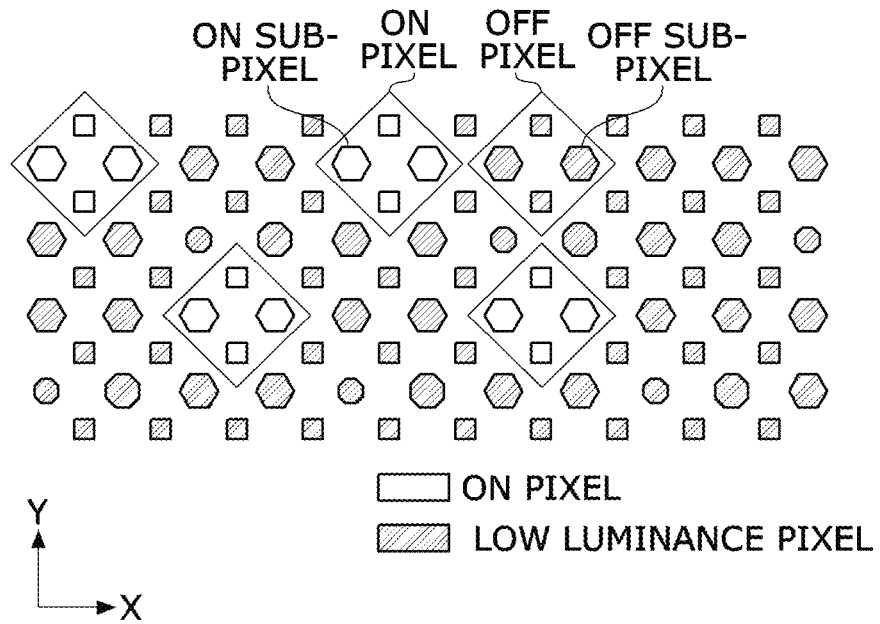
FIGS. 23 and 24 are diagrams showing an example of ON pixels and low luminance pixels that are turned on in a third pixel area.
Figure 24:
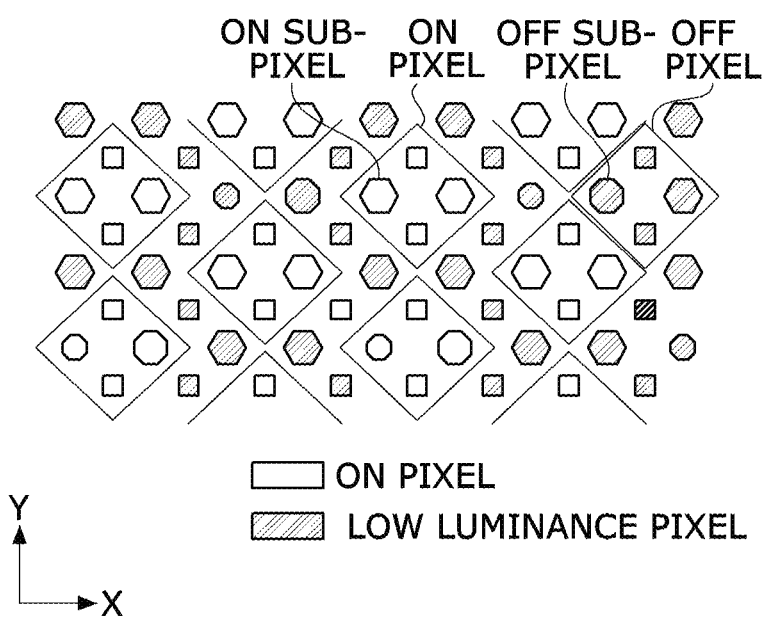

FIGS. 23 and 24 are diagrams showing examples of ON pixels and low luminance pixels that are turned on in the third pixel area BA.

Referring to FIGS. 23 and 24, the boundary pixel area control unit may select ¼ or ½ of the pixels in the third pixel area BA as ON pixels and shift the positions of the ON pixels every frame period. The pixel group PG including ON pixels may be a rhombic or parallelogrammic pixel group. The position of the pixel group may be rotated along a circular, elliptical, or zigzag direction by being shifted by a preset (or selected) movement width every frame period.

The boundary pixel area control unit may control the background pixels other than the ON pixels in the third pixel area BA as low luminance pixels. OFF pixels display a black grayscale without displaying the pixel data and thus appear black, while low luminance pixels display the pixel data with low luminance. The pixel data is written to the ON pixel and the low luminance pixel. The luminance of the low luminance pixel is lower than the maximum luminance of the ON pixel in the same grayscale, especially in a high grayscale. When the background pixels of the third pixel area BA are changed from OFF pixels to low luminance pixels, the luminance of the ON pixels may be lowered.

When the background pixels between the ON pixels in the third pixel area BA are driven as low luminance pixels, it is possible to smoothly control a change in luminance at the boundary between the pixel areas and prevent the boundary line between the pixel areas from being visually recognized. In addition, when the background pixels between the ON pixels in the third pixel area BA are driven as low luminance pixels, a phenomenon in which the flicker in the third pixel area BA is visually recognized may be prevented in a low speed driving mode in which the refresh rate of the pixels is lowered.

The boundary pixel area control unit may control the luminance of each of the ON pixel, the OFF pixel, and the low luminance pixel in the third pixel area BA using a gain value of the pixel data.

In the third pixel area BA, the background pixels other than the ON pixels may include OFF pixels and low luminance pixels.

Figure 25:
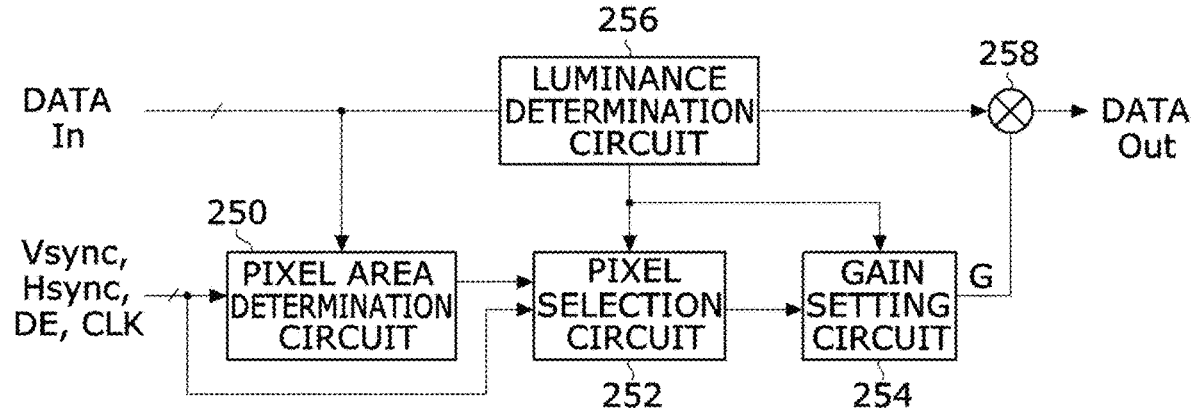
FIG. 25 is a block diagram showing a boundary pixel area control circuit.

FIG. 25 is a block diagram showing a boundary pixel area control circuit.

Referring to FIG. 25, the boundary pixel area control circuit (which is also referred to as the boundary pixel area control unit) includes a pixel area determination circuit 250 (which is also referred to as the pixel area determination unit 250), a pixel selection circuit 252 (which is also referred to as the pixel selection unit 252), a gain setting circuit 254 (which is also referred to as the gain setting unit 254), and a luminance adjustment circuit 258 (which is also referred to as the luminance adjustment unit 258).

The pixel area determination unit 250 counts the pixel data DATA of the input image and determines which pixel area DA, CA, and BA within the screen the pixel data DATA will be written to the pixel.

Data that defines the ON pixel position for each frame is stored in a memory of the pixel selection unit 252. The pixel selection unit 252 defines the positions of the ON pixels in the third pixel area BA every frame period. The pixel selection unit 252 may select the background pixels in the third pixel area BA as OFF pixels or low luminance pixels according to a preset (or selected) algorithm. The pixel selection unit 252 counts the timing signals Vsync, Hsync, DE, and CLK synchronized with the pixel data and outputs pixel position data for classifying the ON pixel, the OFF pixel, and the low luminance pixel every frame period.

The gain setting unit 254 sets a gain G to be written to the pixels of the third pixel area BA. The gain G may be selected as a value between 0 and 1. The gain setting unit 254 outputs a first gain in synchronization with the pixel data to be written into the ON pixel. The gain setting unit 254 outputs a second gain in synchronization with the pixel data to be written into the OFF pixel. The gain setting unit 254 outputs a third gain in synchronization with the pixel data to be written into the low luminance pixel. The first gain may be set to "1" so that the pixel data can be written into the ON pixel as it is. The second gain may be set to "0" so that the OFF pixel can display the black grayscale.

The second gain may be set to a value smaller than 1 and greater than 0 in order to lower the luminance of the pixel data to be written into the low luminance pixel. When at least some of the background pixels in the third pixel area BA are driven as low luminance pixels, the gain setting unit 254 may set the first gain to be smaller than 1 and greater than 0.5 in order to lower the luminance of the ON pixel.

The luminance adjustment unit 258 multiplies each pixel data to be written into the pixels of the third pixel area BA by the gain G inputted from the gain setting unit 254 to adjust the luminance of the third pixel area BA. As a result, the data to be written into the OFF pixel is changed to a black grayscale value, and the luminance value of the pixel data to be written into the low luminance pixel is adjusted to a value lower than an input luminance value. When all the background pixels are OFF pixels, the pixel data to be written into the ON pixels is written into the pixels while having the input luminance value as it is. On the other hand, when at least some of the background pixels are low luminance pixels, the luminance value of the pixel data to be written into the ON pixels is adjusted to a value lower than the input luminance value when all the background pixels are OFF pixels.

The gain setting unit 254 may set a gain of the low luminance pixels to a value greater than 0 so that the background pixels in the third pixel area BA are driven as the low luminance pixels in the low speed driving mode.

In another embodiment, the boundary pixel area control unit may further include a luminance determination unit 256.

The luminance determination unit 256 calculates an average picture level (referred to as "APL") of the input image and determines the average luminance of each of the pixel areas DA, CA, and BA.

When there is a difference between the average luminance of the first pixel area DA and the average luminance of the second pixel area CA, the gain setting unit 254 may set the gains of the ON pixel and low luminance pixel in the third pixel area BA so that the pixels in the third pixel area BA may emit light with an average luminance of the intermediate value. When the average luminance of the first pixel area DA and the average luminance of the second pixel area CA are the same, the gain setting unit 254 may set the gains of the ON pixel and low luminance pixel in the third pixel area BA so that the pixels in the third pixel area BA may emit light with an average luminance of any one of the first and second pixel areas DA and CA. Accordingly, the average luminance of the third pixel area BA may be an intermediate value between the average luminance of the first pixel area DA and the average luminance of the second pixel area CA, or may be controlled equal to the average luminance of the first pixel area DA or the second pixel area CA.

When the average luminance of the first and second pixel areas DA and CA are higher than a preset (or selected) threshold value, the pixel selection unit 252 increases the number of ON pixels in the third pixel area BA. For example, when the average luminance of the first and second pixel areas DA and CA increases to a value equal to or greater than a threshold value, the number of ON pixels in the third pixel area BA may be changed from ¼ PPI to ½ PPI. As a result, when the average luminance of the input image is high and changes, a phenomenon in which a difference in luminance between the pixel areas is clearly visible may be prevented.

The timing controller 130 or the host system 200 includes the boundary pixel area control unit as shown in FIG. 25 to shift the positions of the ON pixels in the third pixel area BA every frame period and control the luminance of the third pixel area BA.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
a first pixel area in which pixels are arranged;
a second pixel area in which pixels are arranged with lower pixels per inch than that of the first pixel area; and
a third pixel area disposed between the first pixel area and the second pixel area, and in which pixels are arranged with the same pixels per inch as that of the first pixel area,
wherein, in operation, some of the pixels in the third pixel area emit light as ON pixels,
wherein positions of the ON pixels in the third pixel area are changed every frame period, and
wherein pixels driven as the ON pixels in a previous frame period are changed to the OFF pixels or the low luminance pixels in a next frame period.

2. The display panel of claim 1, wherein remaining background pixels except for the ON pixels in the third pixel area are driven as OFF pixels, that are turned off, or low luminance pixels,
wherein the low luminance pixels have a luminance level lower than a luminance level of the ON pixels and greater than a luminance level of the OFF pixels, and
wherein the OFF pixels display a black grayscale.

3. The display panel of claim 2, wherein pixel data of an input image is written into the ON pixels and the low luminance pixels.

4. The display panel of claim 2, wherein the luminance of the ON pixels is lowered when the background pixels in the third pixel area change from pixels being driven as OFF pixels to pixels being driven as low luminance pixels.

5. The display panel of claim 1, wherein a boundary line between the second pixel area and the third pixel area has a shape of any one of a rectangle, an octagon, a circle, and an ellipse, and
a boundary line between the first pixel area and the third pixel area has a shape of any one of an ellipse, and a circle.

6. The display panel of claim 1, wherein pixels per inch of the ON pixels in the third pixel area is greater than or equal to pixels per inch of the second pixel area.

7. The display panel of claim 1, wherein pixels per inch of the ON pixels in the third pixel area is less than pixels per inch of the first pixel area and greater than pixels per inch of the second pixel area.

8. The display panel of claim 1, wherein each of the ON pixels includes ON sub-pixels to which pixel data is written,
the third pixel area includes a plurality of pixel groups, and
each of the plurality of pixel groups includes one or two ON pixels or two to four ON sub-pixels.

9. A display panel comprising:
a first pixel area in which pixels are arranged;
a second pixel area in which pixels are arranged with lower pixels per inch than that of the first pixel area; and
a third pixel area disposed between the first pixel area and the second pixel area, and in which pixels are arranged with the same pixels per inch as that of the first pixel area,
wherein, positions of ON pixels emitting light in the third pixel area changes every frame period, and
wherein pixels driven as the ON pixels in a previous frame period are changed to the OFF pixels or the low luminance pixels in a next frame period.

10. The display panel of claim 9, wherein:
remaining background pixels except for the ON pixels in the third pixel area are driven as OFF pixels that are turned off or has low luminance pixels,
the low luminance pixels have a luminance level lower than a luminance level of the ON pixels and greater than a luminance level of the OFF pixels, and
the ON pixels in the third pixel area are moved along a circular, elliptical, or zigzag direction every frame period.

11. The display panel of claim 9, wherein an average luminance of the third pixel area is an intermediate luminance between an average luminance of the first pixel area and an average luminance of the second pixel area.

12. A display device comprising:
a display panel including a first pixel area in which pixels are arranged, a second pixel area in which pixels are arranged with lower pixels per inch than that of the first pixel area, and a third pixel area disposed between the first pixel area and the second pixel area and in which pixels are arranged with the same pixels per inch as that of the first pixel area; and a boundary pixel area control circuit configured to change positions of some of the pixels in the third pixel area to be ON pixels every frame period, and wherein pixels driven as the ON pixels in a previous frame period are changed to the OFF pixels or the low luminance pixels in a next frame period.

13. The display device of claim 12, wherein the boundary pixel area control circuit controls an average luminance of the third pixel area to be an intermediate luminance between an average luminance of the first pixel area and an average luminance of the second pixel area by using gains.

14. The display device of claim 13, wherein the boundary pixel area control circuit controls, when the average luminance of the first pixel area and the average luminance of the second pixel area are the same, the average luminance of the third pixel area to be any one of the average luminance of the first pixel area and the average luminance of the second pixel area by using the gains.

15. The display device of claim 14, wherein the boundary pixel area control circuit increases pixels per inch of the ON pixels in the third pixel area when the average luminance of the first pixel area and the average luminance of the second pixel area increase to a value equal to or greater than a selected threshold value.

16. The display device of claim 12, wherein remaining background pixels except for the ON pixels in the third pixel area are driven as OFF pixels that are turned off or has low luminance pixels, wherein the low luminance pixels have a luminance level lower than a luminance level of the ON pixels and greater than a luminance level of the OFF pixels, and wherein the ON pixels in the third pixel area are moved along a selected direction every frame period.

17. The display device of claim 12, wherein the boundary pixel area control circuit is configured to:

control luminance of the ON pixels and luminance of the low luminance pixels by multiplying pixel data to be written into the ON pixels and the low luminance pixels by different gains;

control the luminance of the low luminance pixels to be lower than the luminance of the ON pixels by multiplying pixel data to be written into the ON pixels and the low luminance pixels by the gains; and change a grayscale value of pixel data to be written into the low luminance pixel to a black grayscale value.

18. The display device of claim 12, wherein the boundary pixel area control circuit is configured to:

control luminance of the ON pixels and luminance of the OFF pixels by multiplying pixel data to be written into the ON pixels and the OFF pixels by different gains, control the luminance of the OFF pixels to be lower than the luminance of the ON pixels by multiplying pixel data to be written into the ON pixels and the OFF pixels by the gains, and change a grayscale value of pixel data to be written into the OFF pixel to a black grayscale value.

19. A display device comprising:

a display panel including a first pixel area in which pixels are arranged, a second pixel area in which pixels are arranged with lower pixels per inch than that the first pixel area, and a third pixel area disposed between the first pixel area and the second pixel area and in which pixels are arranged with the same pixels per inch as that of the first pixel area; and a boundary pixel area control circuit configured to control some of the pixels in the third pixel area to be ON pixels, and control remaining background pixels except for the ON pixels in the third pixel area to be OFF pixels, that are turned off, or low luminance pixels, wherein the low luminance pixels have a luminance level lower than a luminance level of the ON pixels and greater than a luminance level of the OFF pixels, wherein the boundary pixel area control circuit changes positions of the ON pixels in the third pixel area every frame period, and wherein pixels driven as the ON pixels in a previous frame period are changed to the OFF pixels or the low luminance pixels in a next frame period.

20. The display device of claim 19, wherein the boundary pixel area control circuit moves the positions of the ON pixels in the third pixel area along a circular, elliptical, or zigzag direction every frame period.

21. The display device of claim 19, wherein the boundary pixel area control circuit controls pixels that have been driven as the ON pixels in a previous frame period to be driven as the OFF pixels or the low luminance pixels in a next frame period by using the gains.

* * * * *